United States Patent

Nemoto et al.

[11] Patent Number: 6,066,822
[45] Date of Patent: *May 23, 2000

[54] SEMICONDUCTOR DEVICE TESTING APPARATUS AND SEMICONDUCTOR DEVICE TESTING SYSTEM HAVING A PLURALITY OF SEMICONDUCTOR DEVICE TESTING APPARATUS

[75] Inventors: Shin Nemoto, Yono; Yoshihito Kobayashi, Gyoda; Hiroo Nakamura, Kazo; Takeshi Onishi, Gyoda; Hiroki Ikeda, Saitama, all of Japan

[73] Assignee: Advantest Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/809,702

[22] PCT Filed: Jul. 29, 1996

[86] PCT No.: PCT/JP96/02130

§ 371 Date: May 27, 1997

§ 102(e) Date: May 27, 1997

[87] PCT Pub. No.: WO97/05496

PCT Pub. Date: Feb. 13, 1997

[30] Foreign Application Priority Data

| Jul. 28, 1995 | [JP] | Japan | 7-192996 |
| Apr. 5, 1996 | [JP] | Japan | 8-83430 |
| May 10, 1996 | [JP] | Japan | 8-116170 |

[51] Int. Cl.$^7$ .................................................. B07C 5/344
[52] U.S. Cl. ........................ 209/573; 209/574; 209/552
[58] Field of Search ..................... 209/552, 571, 209/573, 574

[56] References Cited

U.S. PATENT DOCUMENTS

| 3,655,041 | 4/1972 | Baker et al. ........................... 209/81 |
| 3,896,935 | 7/1975 | Hjelle et al. ........................... 209/81 |
| 4,170,290 | 10/1979 | Frisbie et al. ........................ 198/524 |
| 4,724,965 | 2/1988 | Willberg ................................ 209/573 |

(List continued on next page.)

FOREIGN PATENT DOCUMENTS

| 660104 | 3/1963 | Canada ................................ 198/573 |
| 61-290373 | 12/1986 | Japan . |
| 62-021533 | 2/1987 | Japan . |
| 62-092645 | 6/1987 | Japan . |
| 3-039665 | 2/1991 | Japan . |
| 3-138956 | 6/1991 | Japan . |
| 4-343077 | 11/1992 | Japan . |
| 06-058986 | 3/1994 | Japan . |
| 06-095125 | 11/1994 | Japan . |
| 8-15373 | 1/1996 | Japan . |

OTHER PUBLICATIONS

U.S. application No. 08/832,774, Watanabe et al., filed Apr. 4, 1997.

*Primary Examiner*—William E. Terrell
*Assistant Examiner*—Mark Deuble
*Attorney, Agent, or Firm*—Staas & Halsey LLP

[57] ABSTRACT

A semiconductor device testing system is provided efficiently utilizes a plurality of semiconductor device testing apparatus. More particularly, a host computer controls a plurality of semiconductor device testing apparatuses and a dedicated classifying machine. A storage information memory stores storage information of each semiconductor device such as a number assigned to each tested semiconductor device such as a number assigned to each tested semiconductor device, the test results of each semiconductor device, and is provided in the host computer. Without sorting the tested devices or with the sorting operation of the tested devices into only two categories in a handler part of each testing apparatus, the tested devices are transferred from the test tray to a general-purpose tray, and during this transfer operation, the storage information of each device is stored in the storage information memory. When all of the tests are completed, the storage information of each device stored in the storage information memory is transmitted to the dedicated classifying machine by which the tested devices are sorted out.

7 Claims, 11 Drawing Sheets

U.S. PATENT DOCUMENTS

| | | | |
|---|---|---|---|
| 4,776,747 | 10/1988 | Swapp et al. | 414/417 |
| 4,869,636 | 9/1989 | Reid et al. | 414/331 |
| 4,926,118 | 5/1990 | O'Connier et al. | 324/158 F |
| 5,307,011 | 4/1994 | Tani | 324/158 F |
| 5,313,156 | 5/1994 | Klug et al. | 198/573 |
| 5,319,353 | 6/1994 | Ohnishi et al. | 198/573 |
| 5,465,850 | 11/1995 | Kase | 209/573 |
| 5,516,028 | 5/1996 | Rasp et al. | 198/573 |
| 5,686,834 | 11/1997 | Okudaira et al. | 324/158.1 |
| 5,772,387 | 6/1998 | Nakamura et al. | 414/416 |
| 5,788,084 | 8/1998 | Onishi et al. | 209/573 |

SEMICONDUCTOR DEVICE TESTING APPARATUS AND SEMICONDUCTOR DEVICE TESTING SYSTEM HAVING A PLURALITY OF SEMICONDUCTOR DEVICE TESTING APPARATUS

BACKGROUND OF THE INVENTION

1. Field of the Invention

The present invention relates to a semiconductor device testing apparatus suitable for testing one or more semiconductor devices, particularly one or more semiconductor integrated circuit elements (as will be referred to as IC or ICs hereinafter) which are typical examples of the semiconductor devices. More particularly, the present invention relates to a semiconductor device testing apparatus of the type in which semiconductor devices to be tested are transported, for testing, to a test or testing section where they are brought into electrical contact with a tester head (a component of the testing apparatus for applying and receiving various electrical signals for testing) to perform an electrical test of the semiconductor devices, followed by being carried out of the test section and then the tested semiconductor devices are sorted out into conformable or pass articles and unconformable or failure articles on the basis of the test results, and a semiconductor device testing system having a plurality of such semiconductor device testing apparatus.

2. Description of the Related Art

Many of semiconductor device testing apparatus (commonly called IC tester) for applying a test signal of a predetermined pattern to a semiconductor device to be tested, i.e. device under test (commonly called DUT) and measuring the electrical characteristics of the devices, have a semiconductor device transporting and handling or processing apparatus (commonly called handler) mounted thereto which transports semiconductor devices to a test section, brings them into electrical contact with a tester head in the test section, after the testing, carries the tested semiconductor devices out of the test section, and sorts them out into pass articles and failure articles on the basis of the test results. In the specification, the testing apparatus which comprises a combination of the IC tester and the handler mounted or connected thereto of the type described above is termed "semiconductor device testing apparatus". In the following disclosure the present invention will be described by taking ICs typical of semiconductor devices for example for clarity of explanation.

As the density of elements integrated on a semiconductor substrate or chip in an IC becomes higher, the number of terminals or pins of the IC is increased, and it is difficult to test such an IC having a large number of terminals using an IC testing apparatus having a naturally dropping type handler mounted thereto in which ICs are caused to slide down in a sloped carrying path or groove by their gravities for testing the ICs. Therefore, the general trend in recent years is toward the use of an IC testing apparatus having a handler called "horizontal transporting system" mounted thereto which can transport ICs to any desired place or position by using suction head means utilizing a vacuum pump which may pick up one to several ICs at a time and X and Y direction transfer means.

There have been previously used in practice following two types of IC testing apparatus each having a horizontal transporting system handler mounted thereto.

(1) One type of the IC testing apparatus is arranged such that a tray on which many ICs are loaded in a plane is placed at a predetermined position of the testing apparatus, a predetermined number of ICs are picked up by suction from the tray by use of a suction head utilizing a vacuum pump (vacuum suction head), the ICs being attracted against the vacuum suction head are transported to a test section through a preheating/precooling section by use of X and Y direction transfer means for testing, and upon completion of the test the tested ICs are sorted out into conformable articles (pass articles) and unconformable articles (failure articles), and transferred onto the corresponding trays by use of X and Y direction transfer means.

(2) The other type of the IC testing apparatus is arranged such that many ICs are loaded in a plane on a general-purpose tray (customer tray) which is used by a user for conveying ICs or storing ICs at a predetermined place or the like in the outside of the testing apparatus, the general-purpose tray with the ICs loaded is placed at a loader section of the testing apparatus where the ICs are transferred from the general-purpose tray onto a test tray capable of withstanding high/low temperatures, the test tray is transported through a constant temperature chamber or thermostatic chamber to a test section where ICs are brought into electrical contact with a tester head in the state that they are being loaded on the test tray for performing a test, and upon completion of the test the test tray with the tested ICs loaded are transported through a temperature-stress removing chamber to an unloader section where the tested ICs are sorted out into pass articles and failure articles and transferred onto the corresponding trays to be reloaded thereon.

The IC testing apparatus having a handler of the former type (1) mounted thereto has a disadvantage that since the number of ICs which undergo a test at a time is limited to two to four, the processing speed is low, and hence a considerable time is required to test all ICs. That is, the IC testing apparatus of the type (1) is not suitable for processing at high speed. On the other hand, the IC testing apparatus having a handler of the latter type (2) mounted thereto has an advantage that since ICs can be brought into electrical contact with a tester head of the testing apparatus in the state that they are being loaded on the test tray in the test section, it is possible to test many of ICs such as 16, 32 or 64 at a time. Therefore, at present, an IC testing apparatus having a handler of the latter type (2) mounted thereto is being mainly used.

A description will be given first regarding the general construction of a conventional IC testing apparatus having a handler of the latter type (2) mounted thereto with reference to FIGS. 4 and 5. The illustrated IC testing apparatus comprises a chamber section 100 for testing ICs such as semiconductor memories which are loaded on a test tray TST and carried on the test tray TST, an IC storage section 200 where ICs which will undergo a test (i.e., ICs to be tested) are sorted out and the tested ICs are sorted out and stored in place, a loader section 300 where ICs to be tested which a user has beforehand loaded on a general-purpose tray (customer tray) KST are transferred and reloaded onto a test tray TST capable of withstanding high/low temperatures, and an unloader section 400 where the tested ICs which have been carried on the test tray TST out of the chamber section 100 subsequently to undergoing a test in the testing chamber 100 are transferred from the test tray TST to one or more general-purpose trays KST to be reloaded on the latter. The unloader section 400 is generally constructed to sort out the tested ICs by categories on the basis of the data of the test results and load them on the corresponding general-purpose trays.

The chamber section 100 comprises a constant temperature or thermostatic chamber 100 for receiving the ICs to be tested loaded on the test tray TST and imposing an intended high or low temperature stress to the ICs, a test or testing chamber 102 for effecting an electrical test on the ICs subjected to the temperature stress in the constant temperature chamber 101, and a temperature-stress removing chamber 103 for removing the temperature stress of the ICs having been applied thereto in the test chamber 102 from the ICs. The test chamber 102 contains therein a tester head 104 of the testing apparatus, supplies various electric signals for testing via the tester head 104 to the ICs to be tested in electrically contact therewith, receives response signals from the ICs, and sends them to the testing apparatus.

Each of the test trays TST is moved in a circulating manner from the loader section 300 through the constant temperature chamber 101 of the chamber section 100, the test chamber 102 of the chamber section 100, the temperature-stress removing chamber 103 of the chamber section 100, and the unloader section 400 in this order, to the loader section 300. The constant temperature chamber 101 and the temperature-stress removing chamber 103 are taller than the test chamber 102, and have upward portions protruding beyond the top of the test chamber 102, respectively. As shown in FIG. 5, a base plate 105 spans between the upward protruding portions of the constant temperature chamber 101 and the temperature-stress removing chamber 103, and a test tray transporting means 108 is mounted on the base plate 105 to transport the test tray TST from the temperature-stress removing chamber 103 to the constant temperature chamber 101.

In case a temperature stress of a high temperature (a thermal stress) has been applied to the ICs to be tested in the constant temperature chamber 101, the temperature-stress removing chamber 103 cools the tested ICs down to room temperature by blowing, after which they are transported to the unloader section 400. On the other hand, in case a temperature stress of a low temperature such as, for instance, −30° C. (a cryogenic stress) has been applied to the ICs to be tested in the constant temperature chamber 101, the temperature-stress removing chamber 103 heats the tested ICs by warm air or a heater up to a temperature at which the ICs have no any dew condensation, and then they are carried out of the temperature-stress removing chamber 103 to the unloader section 400.

The test tray TST with the ICs loaded thereon in the loader section 300 is conveyed from the loader section to the constant temperature chamber 101 within the chamber section 100. The constant temperature chamber 101 has a vertical conveyor means mounted therein which is adapted to support a plurality of (nine, for instance) test trays TST in the form of a stack. In the illustrated example, the vertical conveyor means stacks the transported test trays such that a test tray newly received from the loader section 300 is supported at the uppermost of the stack while the bottom test tray is delivered to the test chamber 102. The ICs to be tested on the uppermost test tray TST are given a predetermined high or low temperature stress while the associated test tray TST is moved sequentially from the top to the bottom of the stack by vertically downward movement of the vertical conveyor means and/or waits till the immediately preceding test tray is brought out of the test chamber 102. The tester head 104 is disposed in the test chamber 102 at the central area thereof, and each of the test trays TST carried out one by one from the constant temperature chamber 101 is conveyed onto the tester head 104 while maintained at the constant temperature, and a predetermined number of the ICs among the ICs on the associated test tray TST are electrically connected to IC sockets (not shown) mounted on the tester head 104, as will be discussed hereinbelow. Upon completion of the test on all of the ICs placed on one test tray TST through the tester head 104, the test tray TST is transported to the temperature-stress removing chamber 103 where the tested ICs on the associated test tray are relieved of temperature stress to be restored to the ambient or room temperature, and thereafter the test tray TST is discharged to the unloader section 400.

Like the constant temperature chamber 101 as described above, the temperature-stress removing chamber 103 is also equipped with a vertical conveyor means adapted to support a plurality of (nine, for instance) test trays TST stacked one on another. In the illustrated example, the test tray TST newly received from the test chamber 102 is supported at the bottom of the stack while the uppermost test tray is discharged to the unloader section 400. The tested ICs on the associated test tray are relieved of temperature stress to be restored to the outside temperature (room temperature) as the associated test tray TST is moved from the bottom to the top of the stack by vertically upward movement of the vertical conveyor means.

The tested ICs as carried on the test tray TST are passed to the unloader section 400 where they are sorted out by categories based on the test results and transferred from the test tray TST onto and stored in the corresponding general-purpose trays for respective categories. The test tray TST thus emptied in the unloader section 400 is transported to the loader section 300 where it is again loaded with ICs to be tested from a general-purpose tray KST onto the test tray TST, after which the same steps of above-described operation are repeated.

As shown in FIG. 5, an IC transfer means for transferring ICs from a general-purpose tray KST to a test tray TST in the loader section 300 may be in the form of X and Y direction transfer means 304 which comprises a pair of spaced parallel rails 301 mounted on the base plate 105 and extending over the loader section 400 in the front-to-back or forward-rearward direction of the testing apparatus (referred to as the Y direction herein), a movable arm 302 which spans between the two rails 301 and has its opposite ends secured thereto in a manner to be movable in the Y direction, and a movable head 303 which is supported by the movable arm 302 in a manner to be movable in the direction in which the movable arm 302 extends, that is in the left to right direction of the testing apparatus (referred to as the X direction herein). With this arrangement, the movable head 303 is allowed to reciprocate between the test tray TST and the general-purpose tray KST in the Y direction and move along the movable arm 302 in the X direction.

On the underside of the movable head 303 are vertically movably mounted IC suction pads. Through the movement of the movable head 303 in the X and Y directions and the downward movement of the suction pads in combination, the suction pads are brought into abutment with the ICs placed on the general- purpose tray KST and pick them up and hold thereto by vacuum suction to transfer them to the test tray TST. The number of suction pads that are mounted on the movable head 303 may be eight, for instance, so that a total of eight ICs may be transferred from the general-purpose tray KST to the test tray TST at one time.

It is to be noted here that means 305 for correcting the position of an IC called "preciser" (FIG. 5) is located between stopping positions for the general-purpose tray KST and the test tray TST. The position correcting means 305 includes relatively deep recesses into which the ICs as being attracted against the suction pads are once released to fall prior to being transferred to the test tray TST. The recesses are each defined by vertical tapered side walls which prescribe for the positions at which the ICs drop into the recesses by virtue of the tapering. After eight ICs have been precisely positioned relative to each other by the position correcting means 305, those eight ICs accurately positioned are again attracted against the suction pads and conveyed to the test tray TST. The reason that the position correcting means 305 is provided is as follows. Recesses of the general-purpose tray TST for holding the ICs are sized larger as compared to the size of ICs, resulting in wide variations in positions of ICs placed on the general-purpose tray KST. Consequently, if the ICs as such were vacuum picked up by the suction pads and transferred directly to the test tray TST, there might be some of the ICs which could not be successfully deposited into the IC storage recesses formed in the test tray TST. This is the reason for requiring the position correcting means 305, as described above which acts to array ICs as accurately as the array of the IC storage recesses formed in the test tray TST.

The unloader section 400 is equipped with two sets of X and Y direction transfer means 404 which are identical in construction to the X and Y direction transfer means 304 provided for the loader section 300. The X and Y direction transfer means 404 perform to transship the tested ICs from the test tray TST delivered out to the unloader section 400 onto the general-purpose tray KST. Each set of the X and Y direction transfer means 404 comprises a pair of spaced parallel rails 401 mounted to extend in the forward-rearward direction of the testing apparatus (Y direction), a movable arm 402 spanning between the pair of rails 401 and movably mounted at opposite ends on the pair of rails 401 in the Y direction, and a movable head 403 mounted on the movable arm 402 for movement therealong longitudinally of the arm, that is, in the right to left direction of the testing apparatus (X direction).

FIG. 6 shows the construction of one example of the test tray TST. The illustrated test tray TST comprises a rectangular frame 12 having a plurality of equally spaced apart parallel cleats 13 between the opposed side frame members 12a and 12b of the frame, each of the cleats 13 having a plurality of equally spaced apart mounting lugs 14 protruding therefrom on both sides thereof and each of the side frame members 12a, 12b opposing the adjacent cleats having similar mounting lugs 14 protruding therefrom. The mounting lugs 14 protruding from the opposed sides of each of the cleats 13 are arranged such that each of the mounting lugs 14 protruding from one side of the cleat 13 is positioned intermediate two adjacent mounting lugs 14 protruding from the opposite side of the cleat. Similarly, each of the mounting lugs 14 protruding from each of the side frame members 12a and 12b is positioned intermediate two adjacent mounting lugs 14 protruding from the opposed cleat. Formed between each pair of opposed cleats 13 and between each of the side frame members 12a and 12b and the opposed cleats are spaces for accommodating a multiplicity of IC carriers 16 in juxtaposition. More specifically, each IC carrier 16 is accommodated in one of an array of rectangular carrier compartments 15 defined in each of said spaces, each compartment 15 including two staggered, obliquely opposed mounting lugs 14 located at the diagonally opposed corners of the compartment. In the illustrated example wherein each cleat 13 has sixteen mounting lugs 14 on either side thereof, there are sixteen carrier compartments 15 formed in each of said spaces, in which sixteen IC carriers 16 are mounted. Since there are four of the spaces, 16×4, that is, 64 IC carriers in total can be mounted in one test tray TST. Each IC carrier 16 is placed on corresponding two mounting lugs 14 and fixed thereto by fasteners 17.

Each of IC carriers 16 is of identical shape and size in its outer contour and has an IC pocket 19 in the center for accommodating an IC element therein. The shape and size of the IC pocket 19 is determined depending on those of the IC element 18 to be accommodated therein. In the illustrated example, the IC pocket 19 is in the shape of a generally square recess. The outer dimensions of the IC pocket 19 are sized so as to be loosely fitted in the space defined between the opposed mounting lugs 14 in the carrier compartment 15. The IC carrier 16 has flanges at its opposed ends adapted to rest on the corresponding mounting lugs 14, these flanges having mounting holes 21 and holes 22 formed therethrough, respectively, the mounting holes 21 being adapted to receive fasteners 17 therethrough and the holes 22 being adapted to pass locating pins therethrough.

In order to prevent IC elements from slipping out of place within the IC carrier 16 or jumping out of the IC carrier 16, a pair of latches 23 are attached to the IC carrier 16, as shown in FIG. 7. These latches 23 are integrally formed with the body of the IC carrier so as to extend upwardly from the base of the IC pocket 19, and are normally resiliently biased such that the top end pawls are urged toward each other by virtue of the resiliency of the resin material of which the IC carrier is made. When the IC element is to be deposited into or removed from the IC pocket 19, the top ends of the two latches 23 are expanded away from each other by a latch releasing mechanism 25 disposed on opposite sides of an IC suction pad 24 for picking up an IC element prior to effectuating the deposition of the IC element into or removal from the IC pocket 19 upon the latch releasing mechanism 25 being moved out of engagement with the latches 23, the latches 23 will snap back to their normal positions by their resilient forces where the deposited IC is held in place against dislodgement by the top end pawls of the latches 23.

The IC carrier 16 holds an IC element in place with its leads or pins 18 exposed downwardly as shown in FIG. 8. The tester head 104 has an IC socket mounted thereto, and contacts 26 of the IC socket upwardly extend from the top surface of the tester head 104. The exposed leads 18 of the IC element are pushed against the contacts 26 of the IC socket to establish electrical connection between the IC element and the socket. To this end, a pusher 20 for pushing and holding an IC element down is mounted above the tester head 104 and is configured to push the IC element accommodated in an IC carrier 16 from above into contact with the tester head 104.

The number of IC elements which may be connected with the tester head 104 at a time depends on the number of IC sockets mounted on the tester head 104. By way of example, where sixty-four IC elements are arranged in an array of 4 lines ×16 rows on a test tray TST as shown in FIG. 9, 4×4, that is, 16 IC sockets are arranged and mounted on the tester head 104 such that the IC elements (shown as obliquely hatched) in every fourth row in each of the lines may be tested all at one time. More specifically, in the first test run the examination is conducted on sixteen IC elements located in the first, fifth, ninth and thirteenth rows in each line, the second test run is effected on another sixteen IC elements located in the second, sixth, tenth and fourteenth rows in each line by shifting the test tray TST by a distance corresponding to one row of IC elements, and the third and fourth test runs are carried out in the similar manner until all of the IC elements are tested. The test results are stored in a memory at the addresses determined by, for instance, serial numbers (serial numbers in one lot or batch) assigned to ICs, the identification number given to the test tray TST and the numbers assigned to the IC pockets in the test tray. It is to be appreciated that where thirty-two IC sockets may be mounted on the tester head 104, only two test runs are required to examine all sixty-four IC elements arranged in an array of 4 lines×16 rows. It is also to be noted that there is another type of IC handler in which ICs to be tested are transferred from the test tray into a socket mounted on the tester head 104 and upon the test being completed the tested ICs are transferred from the socket back onto the test tray to transport the ICs, in the test chamber 102.

The IC storage section 200 comprises an IC storage rack (or stocker) 201 for accommodating general-purpose trays KST loaded with ICs to be tested and a tested IC storage rack (or stocker) 202 for accommodating general-purpose trays KST loaded with tested ICs sorted out by categories on the basis of the test results. The IC storage rack 201 and tested IC storage rack 202 are configured to accommodate general-purpose trays in the form of a stack. The general-purpose trays KST with ICs to be tested carried thereon and stored in the form of a stack in the IC storage rack 201 are transported successively from the top of the stack to the loader section 300 where the ICs to be tested (DUTs) are transferred from the general-purpose tray KST onto a test tray TST on standby in the loader section 300.

Each of the IC storage rack 201 and the tested IC storage rack 202 may be of identical shape and structure. Either of the IC storage rack 201 and any one of the tested IC storage racks 202 comprises, as any one of the IC storage rack 201 and the tested IC storage racks 202 is shown in FIG. 10, a tray supporting frame 203 open at the top and having an opening at the bottom, and an elevator 204 disposed below the frame 203 so as to be vertically movable through the bottom opening. In the tray supporting frame 203 there are stored and supported a plurality of general-purpose trays KST stacked one on another which are vertically moved by the elevator 204 acting through the bottom opening of the frame 203.

In the example illustrated in FIGS. 4 and 5, eight racks STK-1, STK-2, . . . , STK-8 are provided as tested IC storage racks 202 so as to be able to store tested ICs which may be sorted out into eight categories at a maximum according to the test results. This is because in some applications tested ICs may not only be classified into categories of "conformable or pass article" and "unconformable or failure article" but also be subclassified into those having high, medium and low operation speeds among the "pass" articles and those required to be retested among the "failure" articles, and others. Even if the number of classifiable categories is up to eight, the unloader section 400 in the illustrated example is capable of accommodating only four general-purpose trays KST. For this reason, if there occur some among the tested ICs which should be classified into a category other than categories assigned to the general-purpose trays KST arranged in the unloader section 400, the procedures taken are to return one of the general-purpose trays KST from the unloader section 400 to the IC storage section 200 and in replacement to transfer a general-purpose tray KST for storing the ICs belonging to the new additional category from the IC storage section 200 to the unloader section 400 where those ICs are stored in the new tray.

Referring to FIG. 5, a tray transfer means 205 is disposed above the IC storage rack 201 and the tested IC storage racks 202 for movement over the entire extent of the storage racks 201 and 202 in the direction of arrangement of the racks (in the right to left direction of the testing apparatus) relative to the base plate 105. The tray transfer means 205 is provided on its bottom with grasp means for grasping a general-purpose tray KST. The tray transfer means 205 is moved to a position over the IC storage rack 201 whereupon the elevator 204 is actuated to lift the general-purpose trays KST stacked in the IC storage rack 201, so that the uppermost general-purpose tray KST may be picked up by the grasp means of the tray transfer means 205. Once the uppermost general-purpose tray KST loaded with ICs to be tested has been transferred to the tray transfer means 205, the elevator 204 is lowered to its original position. The tray transfer means 205 is then horizontally moved to and stopped at a predetermined position in the loader section 300 where the grasp means of the tray transfer means 205 is released to allow the general-purpose tray KST to drop into an immediately underlying tray receiver (not shown). The tray transfer means 205 from which the general-purpose tray KST has been unloaded is moved out of the loader section 300. Then, the elevator 204 is moved upward from below the tray receiver having the general-purpose tray KST deposited thereon to lift up the tray receiver and hence the general-purpose tray KST loaded with ICs to be tested so that the general-purpose tray KST is kept exposed up through a window 106 formed in the base plate 105.

The base plate 105 is formed in the area overlying the unloader section 400 with another two similar windows 106 through which empty general-purpose trays are kept exposed. In this example, each of the windows 106 is sized to expose two general-purpose trays therethrough. Hence, four empty general-purpose trays are kept exposed up through two windows 106. Tested ICs are sorted out and stored in these empty general-purpose trays KST according to the categories assigned to respective trays. As with the loader section 300, the four empty general-purpose trays KST are placed on the respective tray receivers which are moved up and down by the associated elevators 204. Once one general-purpose tray KST has been fully filled, the tray is lowered from the level of the window 16 by the elevator 204 and stored in the tray storage position assigned to said tray by the tray transfer means 205. Indicated by the numeral 206 in FIGS. 4 and 5 is an empty tray storage rack for accommodating empty general-purpose trays KST. From this empty tray storage rack 206, empty general-purpose trays are transported to the respective windows 106 by the tray transfer means 205 and the elevators 204 and held thereat by the associated elevators 204 to be ready for receiving tested ICs.

As described above, in an IC testing apparatus having a handler of the foregoing type (2) mounted thereto in which ICs to be tested are transferred onto a test tray and transported to the test section (chamber section) to perform a test, it is possible to reduce a time required to test all the ICs because the number of ICs undergoing a test at a time can be increased. On the other hand, in the unloader section it takes a considerable time to carry out the transfer operation of the tested ICs since only ICs of eight or so are sorted out and transferred from a test tray onto a general-purpose tray at a time. Moreover, the transfer operation of the tested ICs in the unloader section accompanies the sorting operation of the tested ICs which takes a considerable time. To this end, though two sets of X and Y direction transfer means are provided in the unloader section 400, there still occurs a disadvantage that a time needed to sort out the tested ICs is longer than a time required to test all the ICs.

In addition, in an IC testing apparatus having a handler of the foregoing type (2) mounted thereto, in transferring the tested ICs from a test tray TST onto a general-purpose tray KST in the unloader section 400, the X and Y direction transfer means 404 stores in a storage device the facts that the tested ICs on the test tray have been transferred onto general-purpose trays by storing the addresses assigned to the respective IC carriers 16 on the associated test tray TST, and it performs the transfer operation of the tested ICs onto general-purpose trays on the basis of the stored addresses so as not to remain any tested IC or ICs which have failed to transfer on the test tray TST. However, there is a rare case that the tested IC or ICs remain on the test tray without being transferred therefrom.

If one or more tested ICs should not have been transferred and have remained on the test tray TST in the unloader section 400, the test tray TST loaded with one or more ICs not transferred is transported to the loader section 300, and hence an IC or ICs to be tested are loaded on the remaining tested IC or ICs in the form of a stack. In such case, the IC to be tested positioned at the upper side of the stack protrudes upwardly from the upper surface of the test tray. Therefore, there occurs a disadvantage that when the test tray loaded with the stack or stacks each of two ICs is transported to the constant temperature chamber 101 and then the subsequent test tray is stacked on the test tray with the stack or stacks of two ICs in the constant temperature chamber 101, the IC to be tested positioned at the upper side of the stack and protruding upwardly is pushed out of the associated test tray by insertion of the subsequent test tray and dropped down therefrom or an accident such as breakage of the IC to be tested may happen.

If an accident occurs that an IC drops down out of the associated test tray TST in the constant temperature chamber 101, it may occur that the IC drops down on a carrying mechanism or the like provided on the lower side of the constant temperature chamber 101 and interferes therewith so that the carrying mechanism can fail to convey. In addition, if the IC to be tested as being stacked on the remaining tested IC should be tested and transported to the unloader section 400 without dropping out of the test tray, the upper IC in the stack is sorted out on the basis of the test results of the lower remaining tested IC in the stack, and hence there is a disadvantage that an erroneous classification is done.

SUMMARY OF THE INVENTION

It is therefore an object of the present invention to provide an IC testing system which can carry out at high speed the transfer operation of the tested ICs from a test tray to a general-purpose tray in the unloader section.

A second object of the present invention is to provide an IC testing system having a plurality of IC testing apparatus in which tests of different conditions can sequentially be carried out on a large number of ICs using the plurality of IC testing apparatus, and in which plural test runs to be performed on a large number of ICs can be all executed within a time interval as short as possible and the sorting operation of the tested ICs based on the test results thereof can also be performed in a short time.

A third object of the present invention is to provide an IC testing apparatus which is able to prevent from occurring an accident that one or more tested ICs are left on a test tray without being transferred therefrom.

A fourth object of the present invention is to provide an IC testing apparatus which is capable of detecting that one or more ICs have been dropped out from the associated test tray loaded with ICs thereon.

According to a first aspect of the present invention, there is provided an IC testing system including an IC testing apparatus which is arranged such that ICs to be tested are transferred from a general-purpose tray onto a test tray to be reloaded thereon in a loader section, the test tray with the ICs loaded thereon is transported through a constant temperature or thermostatic chamber into a test or testing section where the ICs loaded on the test tray are caused to undergo a test, and after the completion of the test, the test tray with the tested ICs loaded thereon is transported to an unloader section where the tested ICs are transferred from the test tray onto a general-purpose tray, and further comprising a dedicated classifying machine for exclusively performing the sorting operation of the tested ICs loaded on the general-purpose tray, and storage information memory means provided in a host computer for controlling the IC testing apparatus or in the IC testing apparatus. Storage information such as the test results of each tested IC stored in corresponding one IC receiving portion of the general-purpose tray, the number of a socket with which the IC has been brought into contact in the test section, and the like is stored in the storage information memory means at an address thereof which is determined by a serial number assigned to each IC, an identification number assigned to each general-purpose tray, and the number assigned to each of IC receiving portions of each general-purpose tray, and the classifying operation of the tested ICs is done on the basis of the storage information using the dedicated classifying machine.

With the IC testing system according to the first aspect of the invention, it is possible that all the tested ICs can be sorted by the dedicated classifying machine utilizing the storage information stored in the storage information memory means. Accordingly, since there is no need for carrying out the classifying operation of the tested ICs and only the transfer operation of the ICs from the test tray to the general-purpose tray is required in the unloader section, the transfer operation of the ICs can be done at high speed. In particular, in case there is not disposed in the unloader section a general-purpose tray corresponding to the category into which the tested IC is to be sorted, because of many categories into which the tested ICs are to be sorted, it is unnecessary to transport a general-purpose tray for the corresponding category to the unloader section, and hence the processing speed can be improved.

According to a second aspect of the present invention, there is provided an IC testing system including a plurality of IC testing apparatus each of which is arranged such that ICs to be tested are transferred from a general-purpose tray onto a test tray to be reloaded thereon in a loader section, the test tray with the ICs loaded thereon is transported through a constant temperature or thermostatic chamber into a test section where the ICs loaded on the test tray are caused to undergo a test, and after the completion of the test, the test tray with the tested ICs loaded thereon is transported to an unloader section where the tested ICs are transferred from the test tray onto a general-purpose tray, and further comprising a dedicated classifying machine for exclusively performing the sorting operation of the tested ICs loaded on the general-purpose tray, and storage information memory means provided in a host computer for controlling the plurality of IC testing apparatus or in each IC testing apparatus. Storage information such as the test results of each IC stored in corresponding one IC receiving portion of the general-purpose tray, the number of a socket with which the IC has been brought into contact in the test section, and the like is stored in the storage information memory means at an address thereof which is determined by a serial number assigned to each IC, an identification number assigned to each general-purpose tray, and the number assigned to each of the IC receiving portions of each general-purpose tray. Each IC testing apparatus sorts out the tested ICs into only two categories of the conformable or pass ICs and the unconformable or failure ICs, and the dedicated classifying machine executes the sub-classifying operation of the tested ICs on the bICs on the basis of the storage information stored in the storage information memory means.

In the IC testing system according to the second aspect of the invention, since the classifying operation of the tested ICs in the unloader section is limited to only choose between the two, the transfer operation of the ICs from the test tray to the general-purpose tray in the unloader section can be carried out at higher speed than the case that the tested ICs are sorted out into all the categories in the unloader section. In addition, since the ICs which have been once determined to be failure ICs are not transported to the subsequent IC testing apparatus for testing under next test condition, the failure ICs cannot be tested again and the testing time can be reduced. Therefore, there is an advantage that ICs can be tested at high speed. Moreover, the tested ICs are further sorted out into sub-categories by the dedicated classifying machine utilizing the storage information stored in the storage information memory means, and hence in case there is not disposed in the unloader section a general-purpose tray corresponding to the category into which the tested IC is to be sorted, it is unnecessary to transport a general-purpose tray for the corresponding category to the unloader section. Accordingly, the processing speed can be increased.

According to a third aspect of the present invention, there is provided an IC testing apparatus which is arranged such that ICs to be tested are transferred from a general-purpose tray to a test tray to be reloaded thereon in a loader section, and the test tray loaded with the ICs is transported into a test section where the ICs undergo a test, after the completion of the test, the test tray loaded with the tested ICs is transported from the test section to an unloader section where the tested ICs on the test tray are transferred from the associated test tray onto a general-purpose tray, and the test tray which has been emptied of the tested ICs is transported from the unloader section to the loader section where new ICs to be tested are loaded on the emptied test tray for successively testing ICs, and comprises an IC detecting sensor for detecting whether an IC exists on the test tray being transported or not, the IC detecting sensor being provided between the unloader section and the loader section so that the presence of any IC having been left on the test tray can be detected.

According to a fourth aspect of the present invention, there is provided an IC testing apparatus which is arranged such that ICs to be tested are transferred from a general-purpose tray to a test tray to be reloaded thereon in a loader section, and the test tray loaded with the ICs is transported into a test section where the ICs undergo a test, after the completion of the test, the test tray loaded with the tested ICs is transported from the test section to an unloader section where the tested ICs on the test tray are transferred from the associated test tray onto a general-purpose tray, and the test tray which has been emptied of the tested ICs is transported from the unloader section to the loader section where new ICs to be tested are loaded on the emptied test tray for successively testing ICs, and comprises an IC detecting sensor for detecting whether an emptied IC receiving portion having no IC therein exists in the test tray or not, the IC detecting sensor being provided on the way of the carrying path of the test tray transported from the test section to the unloader section.

According to a fifth aspect of the present invention, there is provided an IC testing apparatus which is arranged such that ICs to be tested are transferred from a general-purpose tray to a test tray to be reloaded thereon in a loader section, and the test tray loaded with the ICs is transported into a test section where the ICs undergo a test, after the completion of the test, the test tray loaded with the tested ICs is transported from the test section to an unloader section where the tested ICs on the test tray are transferred from the associated test tray onto a general-purpose tray, and the test tray which has been emptied of the tested ICs is transported from the unloader section to the loader section where new ICs to be tested are loaded on the emptied test tray for successively testing ICs, and comprises an IC detecting sensor for detecting whether an emptied IC receiving portion having no IC therein exists in the test tray or not, the IC detecting sensor being provided on the way of the carrying path of the test tray transported from the loader section to the test section.

in the IC testing apparatus of the third aspect of the invention, even if an IC should have been left on the test tray being transported from the unloader section to the loader section, the presence of that IC remaining on the test tray can be detected, and hence, when the test tray arrives at the loader section, the remaining IC on the test tray can be removed from the test tray. As a result, there occurs no accident that two ICs are stacked one on another and the upper side IC of the stack is dropped down on the bottom of the constant temperature chamber. Accordingly, an IC testing apparatus having high safety can be provided.

In the IC testing apparatus of the fourth aspect of the invention, even if any tested IC should drop down out of the test tray in the test section, the position of the IC receiving portion of the test tray from which the IC has been dropped down can be detected during the transportation time of the test tray from the test section to the unloader section. Therefore, it is possible in the unloader section to stop a classifying operation for the IC receiving portion where no IC exists and the time required for the classifying operation can be reduced.

In the IC testing apparatus of the fifth aspect of the invention, even if any IC should drop down out of the test tray during the transportation time of the test tray from the loader section to the test section, the emptied IC receiving portion of the test tray from which the IC has been dropped down can be detected until the test tray arrives at the test section. Therefore, it is possible in the test section to stop a testing operation for the IC receiving portion where no IC exists and the time required for the testing operation can be reduced since no waste of time is expended.

DESCRIPTION OF THE PREFERRED EMBODIMENTS

Figure 1:
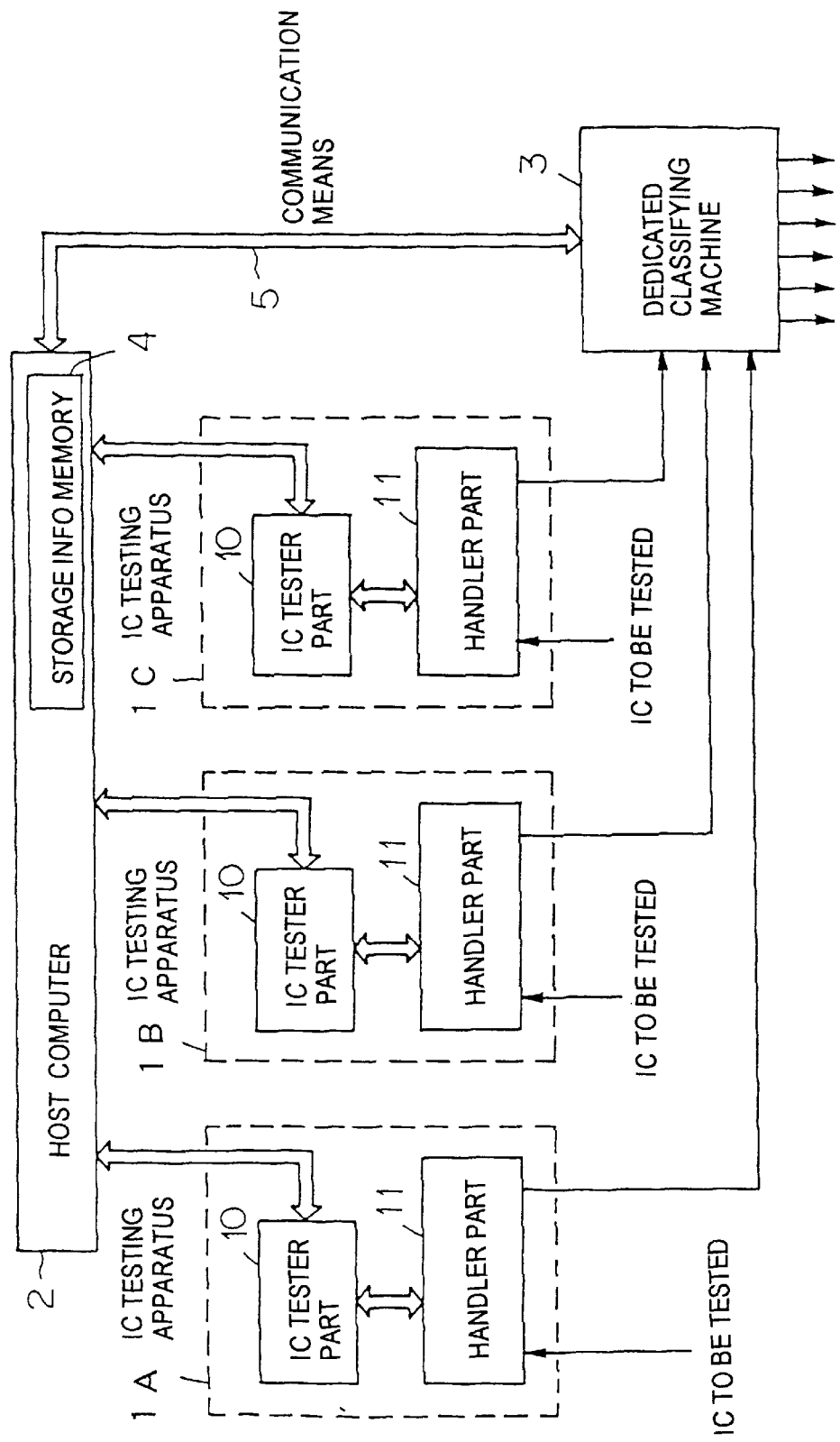
FIG. 1 is a block diagram showing the whole construction of a first embodiment of the IC testing system according to the present invention.
Figure 5:
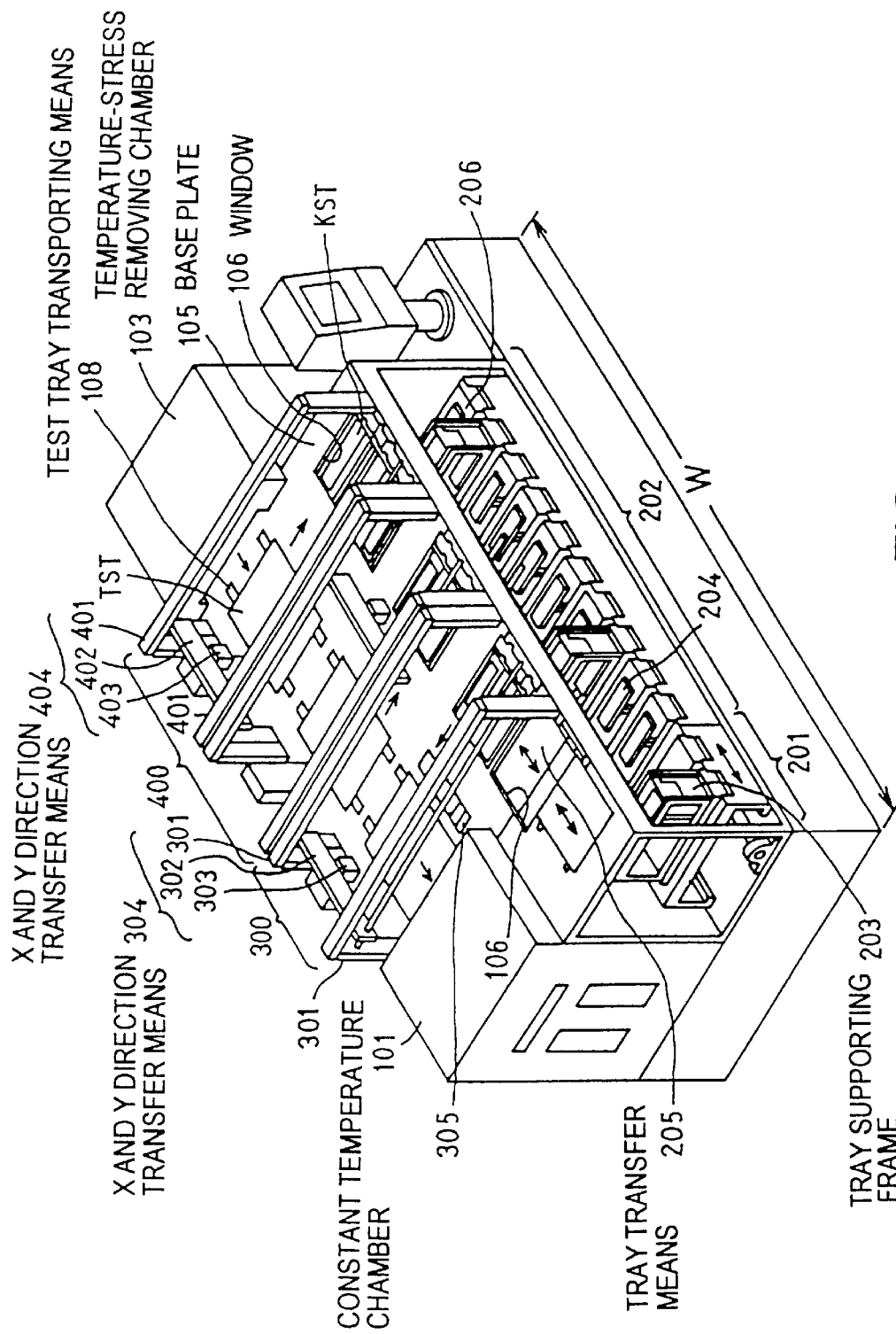
FIG. 5 is a perspective view of the conventional IC testing apparatus shown in FIG. 4.
Figure 6:
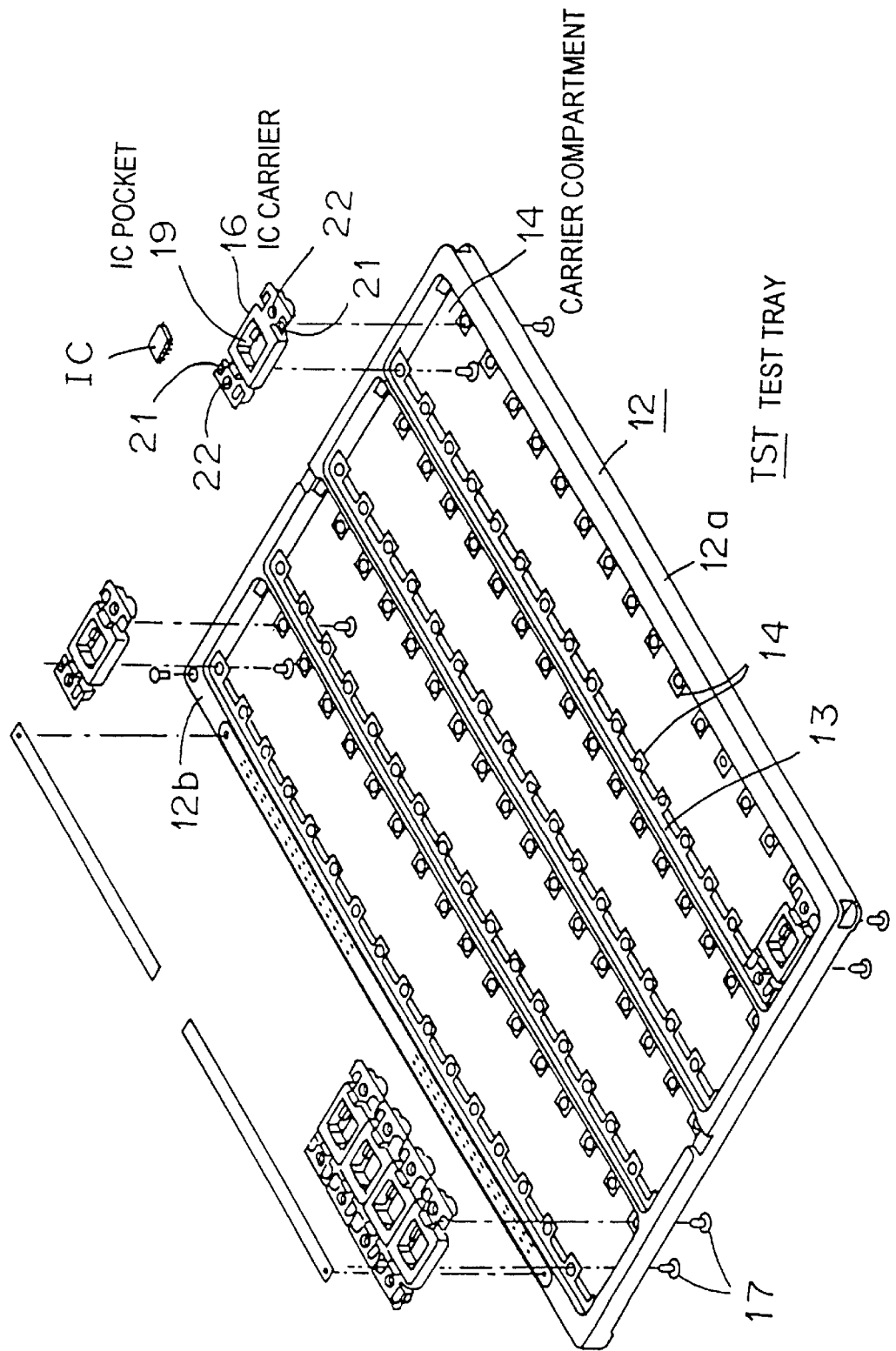
FIG. 6 is an exploded perspective view explaining the structure of an example of a test tray for use in the IC testing apparatus.
Figure 7:
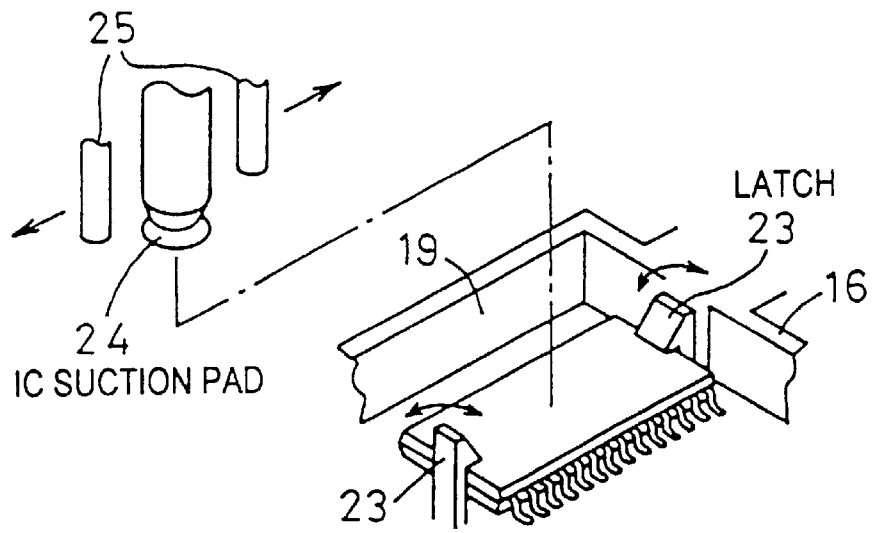
FIG. 7 is a perspective view explaining how ICs are loaded on the test tray depicted in FIG. 6.
Figure 8:
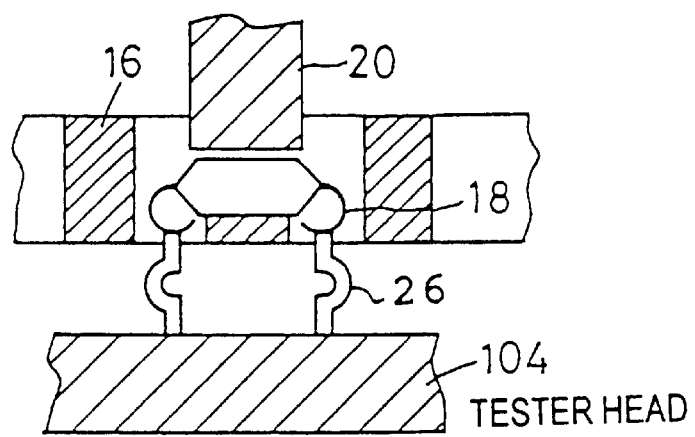
FIG. 8 is an enlarged sectional view illustrating an electrical connection between an IC loaded on the test tray shown in FIG. 6 and a tester head.
Figures 9, 10:
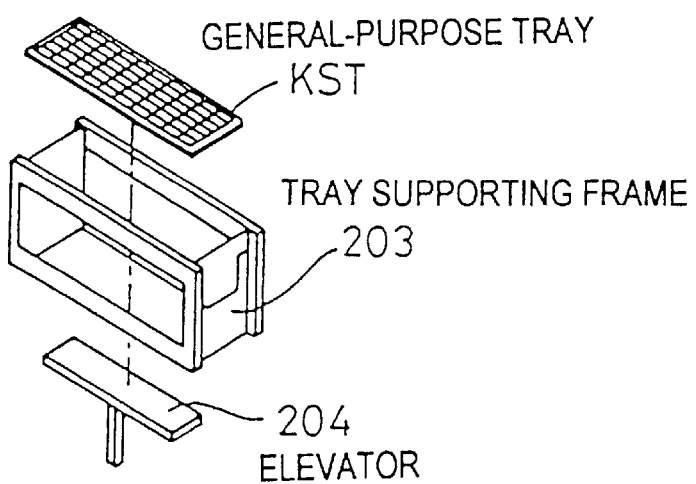
FIG. 9 is a plan view explaining a sequence of steps of testing the ICs to be tested loaded on the test tray.
FIG. 10 is a perspective view illustrating the structure of a rack for storing general-purpose trays for use in the IC testing apparatus.

FIG. 1 shows a first embodiment of the IC testing system according to the present invention. This IC testing system comprises three IC testing apparatus 1A, 1B and 1C. Each of the IC testing apparatus 1A, 1B and 1C has the same construction or configuration and comprises an electrical portion, i.e., an IC tester part 10 (principally the lower electrical portion in FIG. 5) of the IC testing apparatus for measuring the electrical characteristics of ICs under test by applying test signals of a predetermined pattern to the ICs, and a handler part 11 (principally the upper mechanical portion in FIG. 5). The IC tester part 10 of each IC testing apparatus is under control of a host computer 2 and is controlled by this host computer 2. In addition, a dedicated classifying machine 3 for exclusively executing classification of tested ICs is provided. Further, it is often customary to incorporate two handler parts 11 with respect to the single IC tester part 10 so that the combination of the two handler parts and the single IC tester part may be operated as one IC tester apparatus. Although not shown, each of the IC testing apparatus in this embodiment is also arranged such that two handler parts 11 are mounted to single IC tester part.

As with the conventional IC testing apparatus described above with reference to FIGS. 4 to 10, the handler part 11 of each IC testing apparatus 1A, 1B or 1C comprises a chamber section for testing ICs which have been carried on a test tray, an IC storage section for storing ICs to be tested and ICs already tested and sorted out, a loader section where ICs to be tested which a user has beforehand loaded on general-purpose trays are transferred and reloaded onto a test tray capable of withstanding high/low temperatures, and an unloader section where the tested ICs which have been carried on the test tray out of the chamber section subsequently to undergoing a test therein are transferred from the test tray to the general-purpose trays to be reloaded on the latter. The chamber section comprises a constant temperature chamber for imposing a temperature stress of either a designed high or low temperature on ICs to be tested loaded on a test tray, a test chamber for conducting electrical tests on the ICs under the temperature stress imposed in the constant temperature chamber by bringing the ICs into electrical contact with a tester head of the IC tester part 10, and a temperature-stress removing chamber for removing the temperature stress imposed in the constant temperature chamber from the ICs having undergone the tests in the test chamber.

In this embodiment, each of the IC testing apparatus 1A, 1B and 1C is characterized in that each IC testing apparatus tests ICs under the same test condition and the tested ICs are transferred from the test tray to the general-purpose trays without sorting out the tested ICs in the unloader section of each handler part 11, and after plural test runs have been all completed, the tested ICs are transported to the dedicated classifying machine 3 wherein the classifying operation of the tested ICs is executed in a lump.

To this end, in this embodiment, storage information memory means 4 is provided in the host computer 2. All the test results of the ICs are stored in the storage information memory means 4. The test results of the ICs are stored at respective addresses of the storage information memory means 4, each address of which is determined by a serial number assigned to each IC, an identification number given to each general-purpose tray, a number allocated to each of IC Dockets of each general-purpose tray in the correspondence thereto, and the like every time one of the tested ICs is transferred from the test tray to the general-purpose tray in the unloader section of each handler part 11. Examples of the test results include the condition of the tests, a classification of the tested ICs by operation speeds such as "high speed", "medium speed" and "low speed" among the pass ICs, the presence of those required to be retested among the failure ICs, the number of the socket of the tester head with which each IC was brought into on testing, and others. The storage information to be stored is transmitted to the host computer 2 via the IC tester part 10 by means of communication means 5 such as, for example, a GPIB communication port between computers or an RS232C communication port or the like to be stored in the storage information memory means 4.

The storage information memory means 4 may be composed of a memory. The storage information stored in the storage information memory means 4 may be supplied to the dedicated classifying machine 3, for example, by storing the information in a storage medium such as a floppy disk separately for each of the IC testing apparatus 1A, 1B and 1C, or may be transferred to the dedicated classifying machine 3 utilizing the communication means 5.

Figure 2:
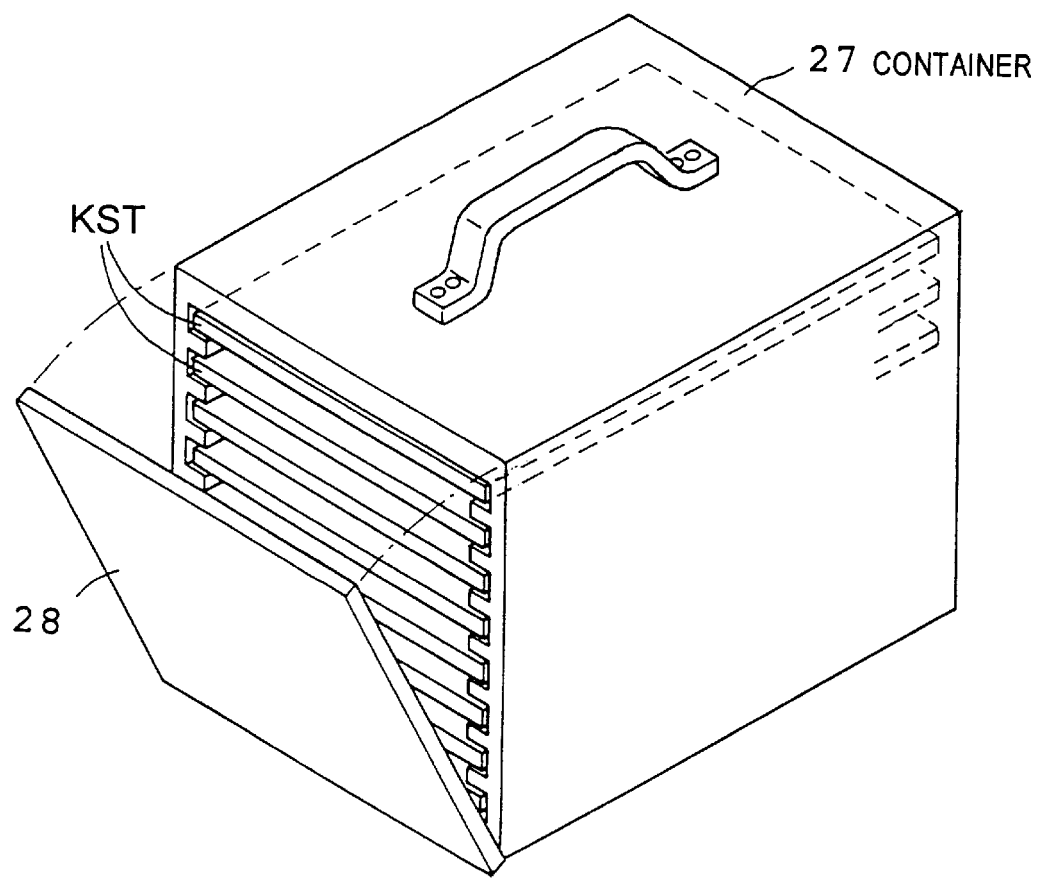
FIG. 2 is a perspective view schematically illustrating an example of the container which can convey a set of plural general-purpose trays and can be used in the IC testing system shown in FIG. 1.

The general-purpose trays each loaded with the tested ICs which have been transferred without having been sorted out in the unloader section of each handler part 11 may be transported to the dedicated classifying machine 3 by accommodating the trays, for example, in a box-shaped container 27 in which shelves for receiving a plurality of the general-purpose trays KST in horizontal positions (levels) are provided as shown in FIG. 2, or may be transported to the dedicated classifying machine 3 by a tray transfer apparatus installed to span between each handler part 11 and the dedicated classifying machine 3. The container 27 has an opening and shutting lid 28 for taking the general-purpose trays KST therein and thereout. The dedicated classifying machine 3 has an IC suction head provided therein, which picks up an IC from a general-purpose tray KST transported to the classifying machine 3, and executes a sorting operation of the tested IC in accordance with the storage information stored at an address corresponding to the position of the general-purpose tray KST from which the IC has been picked up by the IC suction head.

Figure 3:
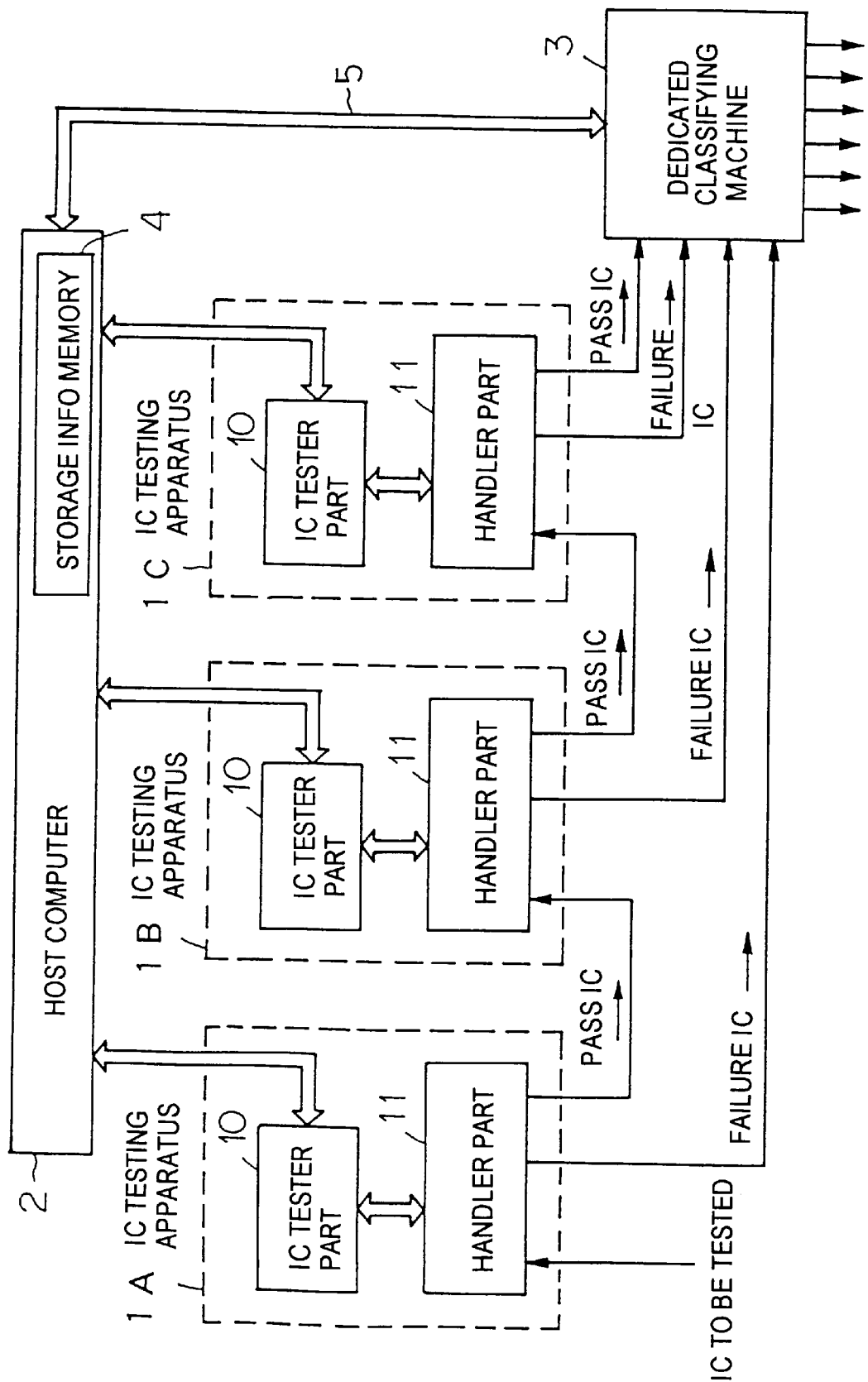
FIG. 3 is a block diagram showing the whole construction of a second embodiment of the IC testing system according to the present invention.
Figure 4:
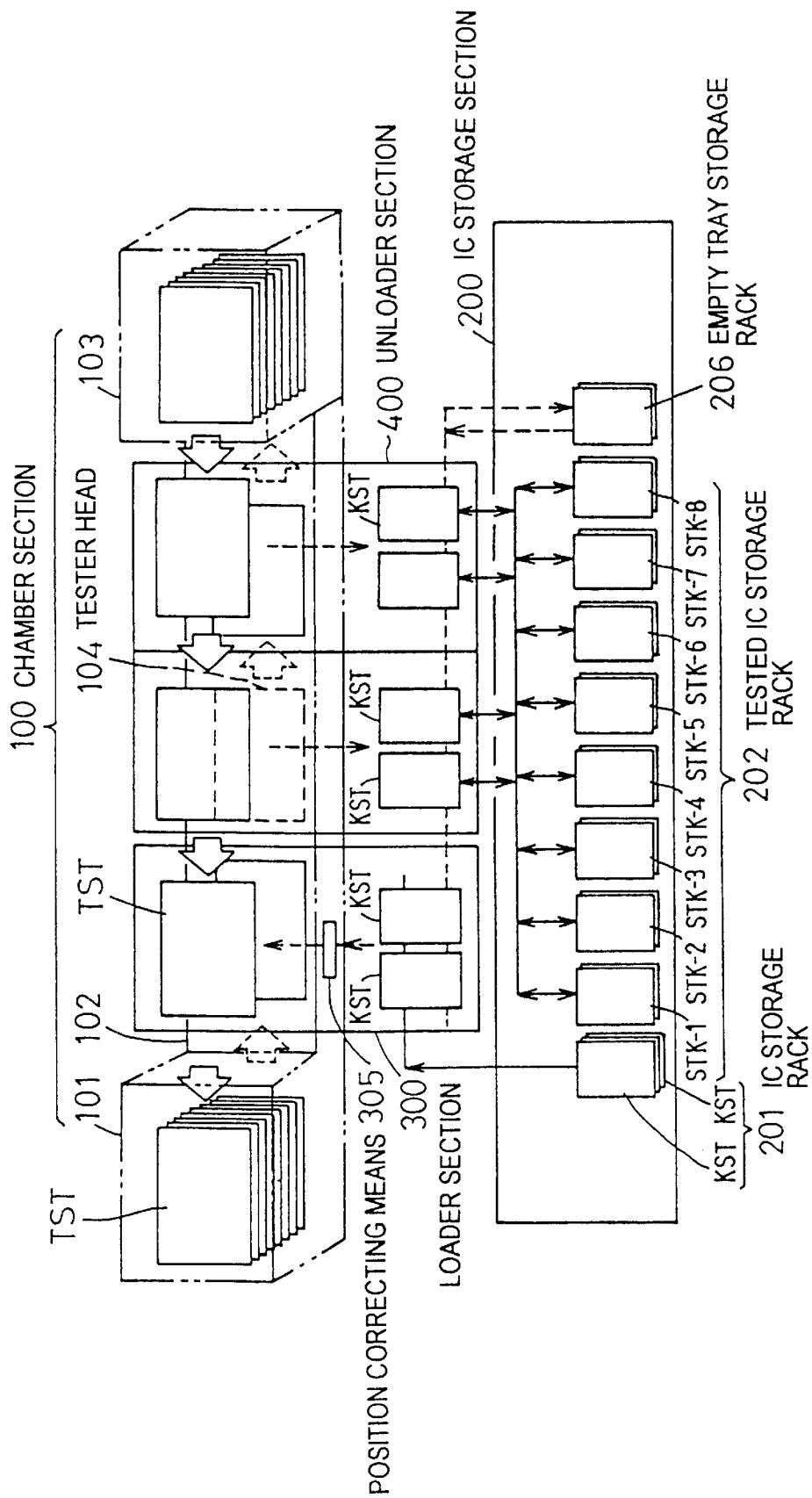
FIG. 4 is a plan view schematically showing a conventional IC testing apparatus with the chamber section viewed in perspective.

FIG. 3 shows a second embodiment of the IC testing system according to the present invention. The IC testing system of this second embodiment also comprises three IC testing apparatus 1A, 1B and 1C as with the aforementioned IC testing system of the first embodiment. Each of the IC testing apparatus 1A, 1B and 1C has the same construction or configuration and comprises an IC tester part 10 which is an electrical portion of the IC testing apparatus for measuring the electrical characteristics of ICs under test by applying test signals of a predetermined pattern to the ICs, and a handler part 11. The IC tester part 10 of each IC testing apparatus is under control of a host computer 2 and is controlled by this host computer 2. In addition, a dedicated classifying machine 3 for exclusively executing classification of tested ICs is provided. Further, each of the IC testing apparatus in this embodiment is also arranged such that two handler parts 11 are mounted to single IC tester part.

Like the conventional IC testing apparatus described above with reference to FIGS. 4 to 10, the handler part 11 of each IC testing apparatus 1A, 1B or IC comprises a chamber section for testing ICs which have been carried on a test tray, an IC storage section for storing ICs to be tested and ICs already tested and sorted out, a loader section where ICs to be tested which a user has beforehand loaded on general-purpose trays are transferred and reloaded onto a test tray capable of withstanding high/low temperatures, and an unloader section where the tested ICs which have been carried on the test tray out of the chamber section subsequently to undergoing a test therein are transferred from the test tray to the general-purpose trays to be reloaded on the latter. The chamber section comprises a constant temperature chamber for imposing a temperature stress of either a designed high or low temperature on ICs to be tested loaded on a test tray, a test chamber for conducting electrical tests on the ICs under the temperature stress imposed in the constant temperature chamber by bringing the ICs into electrical contact with a tester head of the IC tester part 10, and a temperature-stress removing chamber for removing the temperature stress imposed in the constant temperature chamber from the ICs having undergone the tests in the test chamber.

In the second embodiment, each of the IC testing apparatus 1A, 1B and 1C performs a test of ICs under a different test condition from one other. Examples of the test conditions include, for instance, different temperatures imposed on ICs to be tested or different operation voltages applied to ICs under test or the like. In addition, storage information memory means 4 is provided in the host computer 2.

First, all the ICs under test are tested in the first stage IC testing apparatus 1A. The ICs under test are loaded on one or more general-purpose trays and are transported with the general-purpose trays to the handler part 11 of the IC testing apparatus 1A. A plurality of the general-purpose trays are accommodated in, for example, a transporting container 27 as described above with reference to FIG. 2 in the form of a stack. The container 27 is mounted to the handler part 11 of the IC testing apparatus 1A with the lid 28 opened. The general-purpose trays KST are conveyed out of the container 27 one by one and are carried to the loader section. In the loader section, the ICs loaded on a general-purpose tray KST are transferred to a test tray which is transported to the test chamber via the constant temperature chamber. In the test chamber the ICs are electrically contacted to the tester head of the IC tester part 10 located in the test chamber to test the electrical characteristics of the ICs. When the test for all of the ICs loaded on the test tray is completed, the test tray is conveyed out of the test chamber to the temperature stress removing chamber where the tested ICs on the associated test tray are relieved of temperature-stress and thereafter the test tray is discharged to the unloader section.

The tested ICs on the test tray are transferred to a general-purpose tray KST in the unloader section. In case this transfer operation is performed, in this second embodiment, at least two empty general-purpose trays KST are transported to the unloader section and the tested ICs are sorted out into only pass ICs and failure ICs which are to be loaded separately on the empty general-purpose trays KST. When a general-purpose tray KST is filled up with pass ICs or failure ICs, the filled general-purpose tray KST is carried back into the container 27 by transporting means. In the container 27, the general-purpose trays KST each having the failure ICs loaded thereon are received, for instance, in the lower side shelves in order from the lowermost shelf such that the first general-purpose tray KST loaded with the failure ICs is received in the lowermost shelf, the second general-purpose tray KST loaded with the failure ICs is received in the second lowermost shelf, and so on. On the other hand, the general-purpose trays KST each having the pass ICs loaded thereon are received, for instance, in the upper side shelves in order from the uppermost shelf such that the first general-purpose tray KST loaded with the pass ICs is received in the uppermost shelf, the second general-purpose tray KST loaded with the pass ICs is received in the second uppermost shelf, and so on. In such a way, the general-purpose trays each loaded with the pass ICs and the general-purpose trays each loaded with the failure ICs are classified in the container 27.

When the test in the first stage IC testing apparatus 1A is completed, the container 27 accommodating the general-purpose trays KST on which the tested ICs are loaded as described above is moved to the second stage IC testing apparatus 1B. This second stage IC testing apparatus 1B performs a test under the condition which is different from that in the first stage IC testing apparatus 1A. In the second stage IC testing apparatus 1B, however, only the general-purpose trays loaded with the tested pass ICs are taken out of the container 27 and are conveyed to the loader section where only the ICs as determined to be pass ICs will be tested. As a result of the test executed in the second IC testing apparatus 1B, namely, the second test run, when one or more ICs are determined to be failure ICs, a general-purpose tray loaded with the failure ICs and accommodated in the container 27 (a tray having empty IC pockets therein) is transported to the unloader section where the tested ICs as determined to be failure ICs in the second stage IC testing apparatus 1B are transferred from the test tray to that general-purpose tray. In case any of the general-purpose trays each loaded with the failure ICs and accommodated in the container 27 has no empty IC pocket therein, an empty general-purpose tray is transported to the unloader section from the container 27 or from an empty tray storage rack.

When all of the tested ICs as determined to be pass ICs in the first stage IC testing apparatus 1A are tested in the second stage IC testing apparatus 1B, and the general-purpose trays loaded with the pass ICs and the general-purpose trays loaded with the failure ICs are received in the container 27, the container 27 is moved to the third stage IC testing apparatus 1C. This third stage IC testing apparatus 1C executes a test under the condition which is further different from those in the first and second stage IC testing apparatus 1A and 1B. As with the immediately preceding IC testing apparatus 1B, only the general-purpose trays loaded with the tested pass ICs are taken out of the container 27 and are conveyed to the loader section where only the ICs as determined to be pass ICs will be tested in the third stage (last stage) IC testing apparatus 1C. The last stage IC testing apparatus 1C transmits the test results to the host computer 2 for each IC loaded on each general-purpose tray, and the transmitted test results are stored in the storage information memory means 4 provided in the host computer 2.

As a result of the test executed in the last stage IC testing apparatus 1C, namely, the third test run, when one or more ICs are determined to be failure ICs, a general-purpose tray loaded with the failure ICs and accommodated in the container 27 (a tray having empty IC pockets therein) is transported to the unloader section where the tested ICs as determined to be failure ICs in the last stage IC testing apparatus 1C are transferred from the test tray to that general-purpose tray. In case any of the general-purpose trays each loaded with the failure ICs and accommodated in the container 27 has no empty IC pocket therein, an empty general-purpose tray is transported to the unloader section from the container 27 or from an empty tray storage rack.

When all of the ICs as determined to be pass ICs in the preceding two test runs are testing apparatus stage IC testing apparatus 1C, the container 27 is moved from the last stage IC testing apparatus 1C to the dedicated classifying machine 3. The dedicated classifying machine 3 sorts out the tested ICs in the container 27 in accordance with the storage information sent from the host computer 2. In this case, since the storage information sent from the host computer 2 is only the information on the tested ICs transmitted from the last stage IC testing apparatus 1C, the test results of the tested ICs as determined to be failure ICs in the first and second two test runs have not been stored in the storage information memory means 4 of the host computer 2. Therefore, if it is desired to further subclassify the tested ICs as determined to be failure ICs in the first and second test runs, although it takes some time period to execute the sorting operation, the test results of the tested ICs as determined to be failure ICs in the first and second stage IC testing apparatus 1A and 1B may be transmitted from the IC testing apparatus 1A and 1B to the host computer 2 to be stored in the storage information memory means 4, and on completing all of the tests, the tested ICs as determined to be failure and received in the container 27 may also be sorted out in subclasses in accordance with the storage information transmitted from the host computer 2 using the dedicated classifying machine 3.

Further, the examples that three IC testing apparatus 1A, 1B and 1C are provided have been described in the first and second embodiments shown in FIGS. 1 and 3, respectively. However, there is no limitation on the number of IC testing apparatus. In addition, only by a combination of the IC testing apparatus 1C and the dedicated classifying machine 3, the processing speed in the handler part 11 can be increased. Accordingly, even by the combination of the IC testing apparatus 1C and the dedicated classifying machine 3, the aforementioned object of the present invention can be achieved. Further, the IC testing system of the second embodiment can effectively be applied to an IC testing apparatus having a handler of the type (1) mounted thereto as described in the prior art paragraph.

Figure 11:
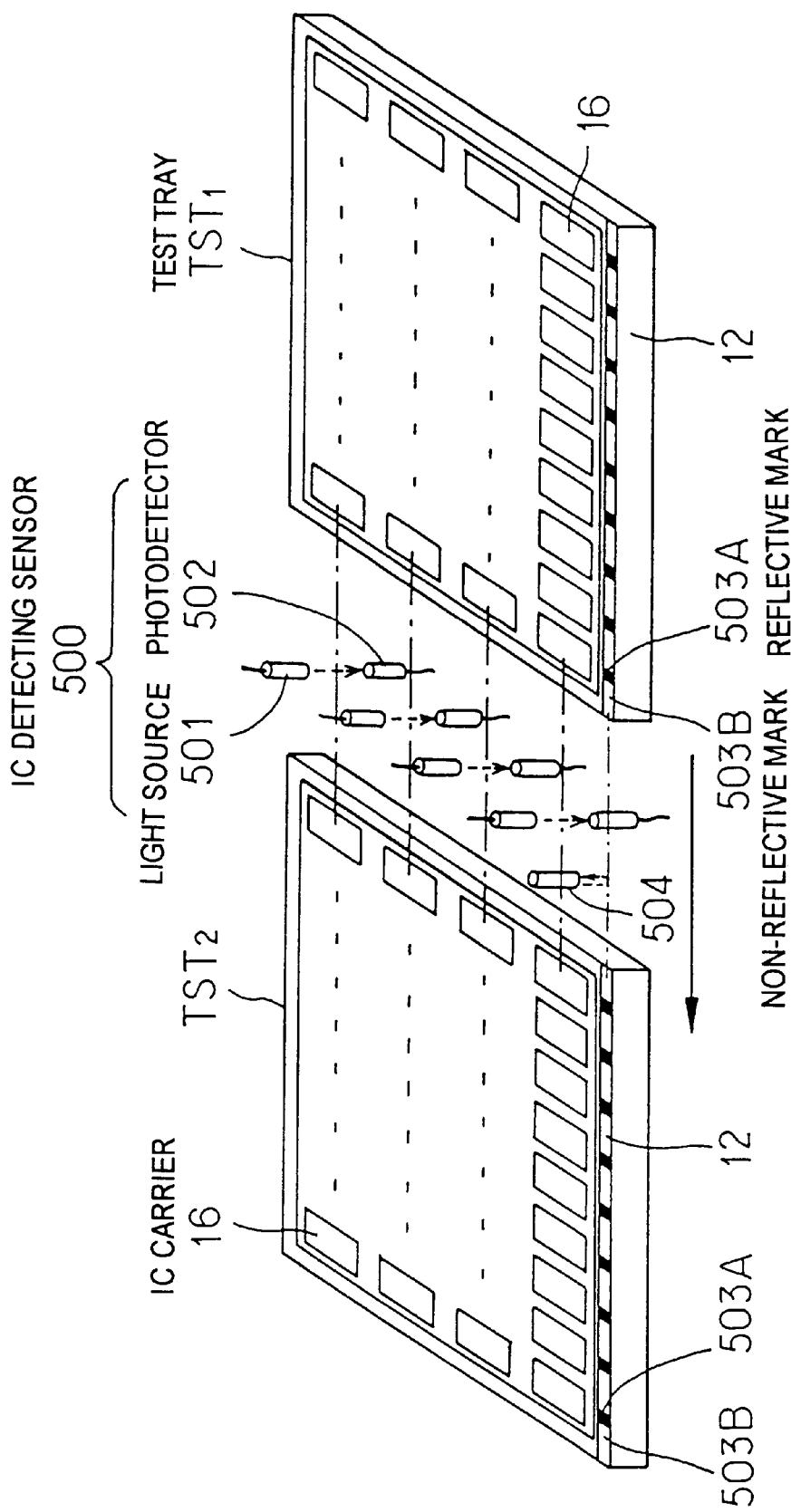
FIG. 11 is a perspective view showing a construction of the main portion of an embodiment of the IC testing apparatus according to the present invention.

FIG. 11 shows an embodiment of the IC testing apparatus according to the present invention. This IC testing apparatus has a handler of the aforementioned type (2) mounted thereto, and comprises an IC tester part (principally the lower electrical portion in FIG. 5) which is an electrical portion of the IC testing apparatus for measuring the electrical characteristics of ICs under test by applying test signals of a predetermined pattern to the ICs, and a handler part (principally the upper mechanical portion in FIG. 5). As with the conventional IC testing apparatus described above with reference to FIGS. 4 to 10, the handler part comprises a chamber section for testing ICs which have been carried on a test tray, an IC storage section for storing ICs to be tested and ICs already tested and sorted out, a loader section where ICs to be tested which a user has beforehand loaded on general-purpose trays are transferred and reloaded onto a test tray capable of withstanding high/low temperatures, and an unloader section where the tested ICs which have been carried on the test tray out of the chamber section subsequently to undergoing a test therein are transferred from the test tray to the general-purpose trays to be reloaded on the latter. The chamber section comprises a constant temperature chamber for imposing a temperature stress of either a designed high or low temperature on ICs to be tested loaded on a test tray, a test chamber for conducting electrical tests on the ICs under the temperature stress imposed in the constant temperature chamber by bringing the ICs into electrical contact with a tester head of the IC tester part, and a temperature-stress removing chamber for removing the temperature stress imposed in the constant temperature chamber from the ICs having undergone the tests in the test chamber.

FIG. 11 is an illustration for explaining the construction of an essential portion of this embodiment wherein a test tray $TST_1$ being stopped at an unloader section 400 of the handler part, a test tray $TST_2$ being stopped at a loader section 300, and an IC detecting sensor 500 provided between the unloader section 400 and the loader section 300 are shown. This IC detecting sensor 500 serves to detect whether or not an IC Is left on each of the IC carriers 16 (see FIG. 6) mounted to the test tray TST.

In this embodiment, there is shown a case in which a plurality of light transmission type IC detecting sensors 500 each comprising a light source 501 and a photodetector 502 are disposed between the unloader section 400 and the loader section 300 such that the light source 501 and the photodetector 502 of each sensor 500 are opposed to each other with a plane through which a test tray TST passes put therebetween, and aligned in the direction orthogonal to the moving direction of the test tray TST, thereby to detect whether or not an IC is left on the test tray TST passing through the plane.

The IC detecting sensor 500 is provided corresponding to the number of lines (the number of transverse rows along the moving direction of the test tray) of the IC carriers 16 mounted to the test tray TST. That is, when the number of carriers 16 mounted to the test tray TST aligned in the direction orthogonal to the moving direction of the test tray TST (in the direction of a longitudinal row) is four (the number of lines is four) as shown, four IC detecting sensors 500 may be arranged at a Ditch that is an interval between the four IC carriers 16 aligned in the direction of the longitudinal row. In the illustrated example, the light sources 501 are provided on the upper side of the plane through which the test tray passes, and the photodetectors 502 are provided on the lower side of the plane through which the test tray passes. The light sources 501 and the photodetectors 502 may be, of course, arranged in the reverse relation.

Figure 12:
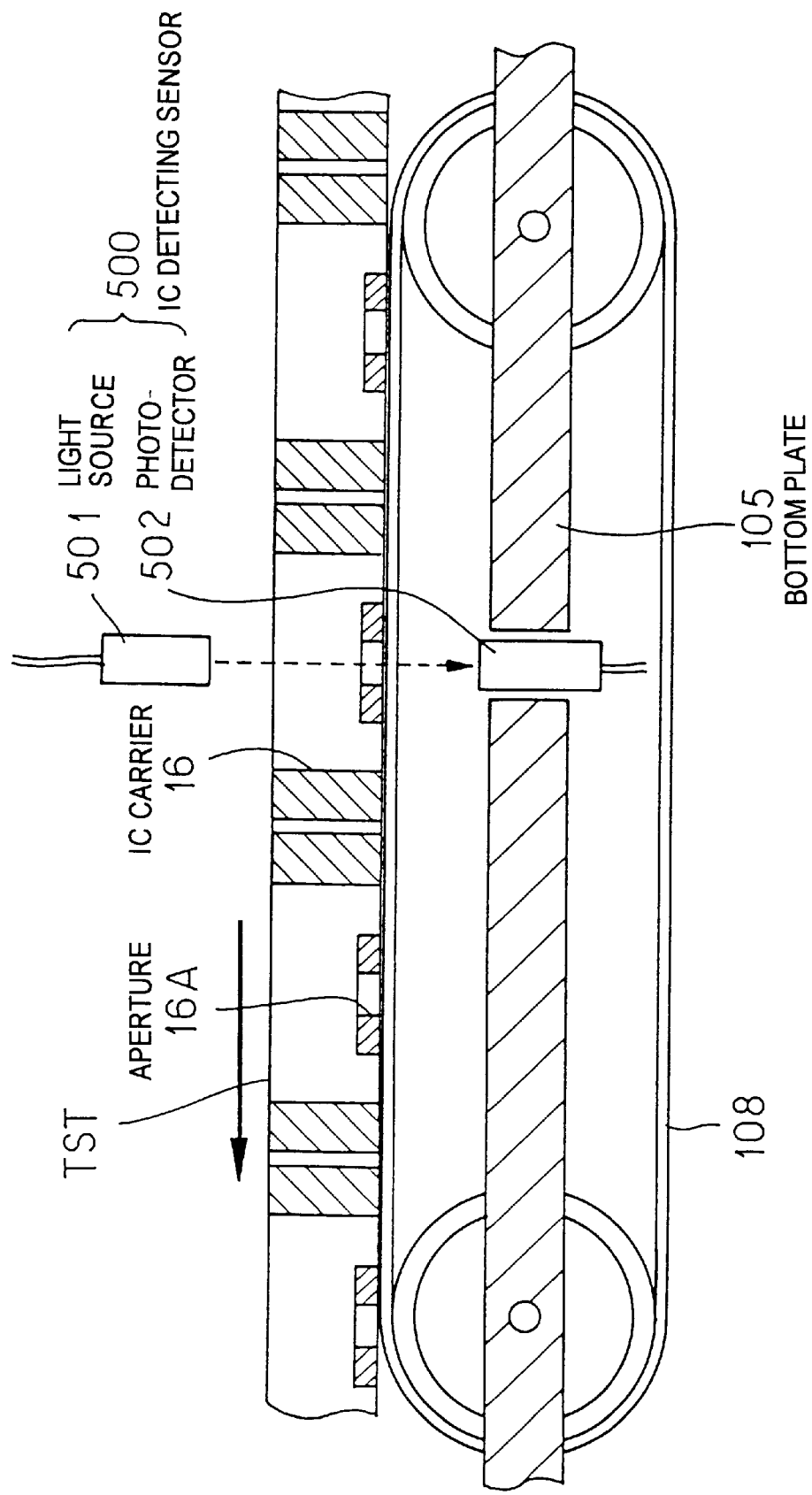
FIG. 12 is a generally sectional view of FIG. 11.
Figure 13:
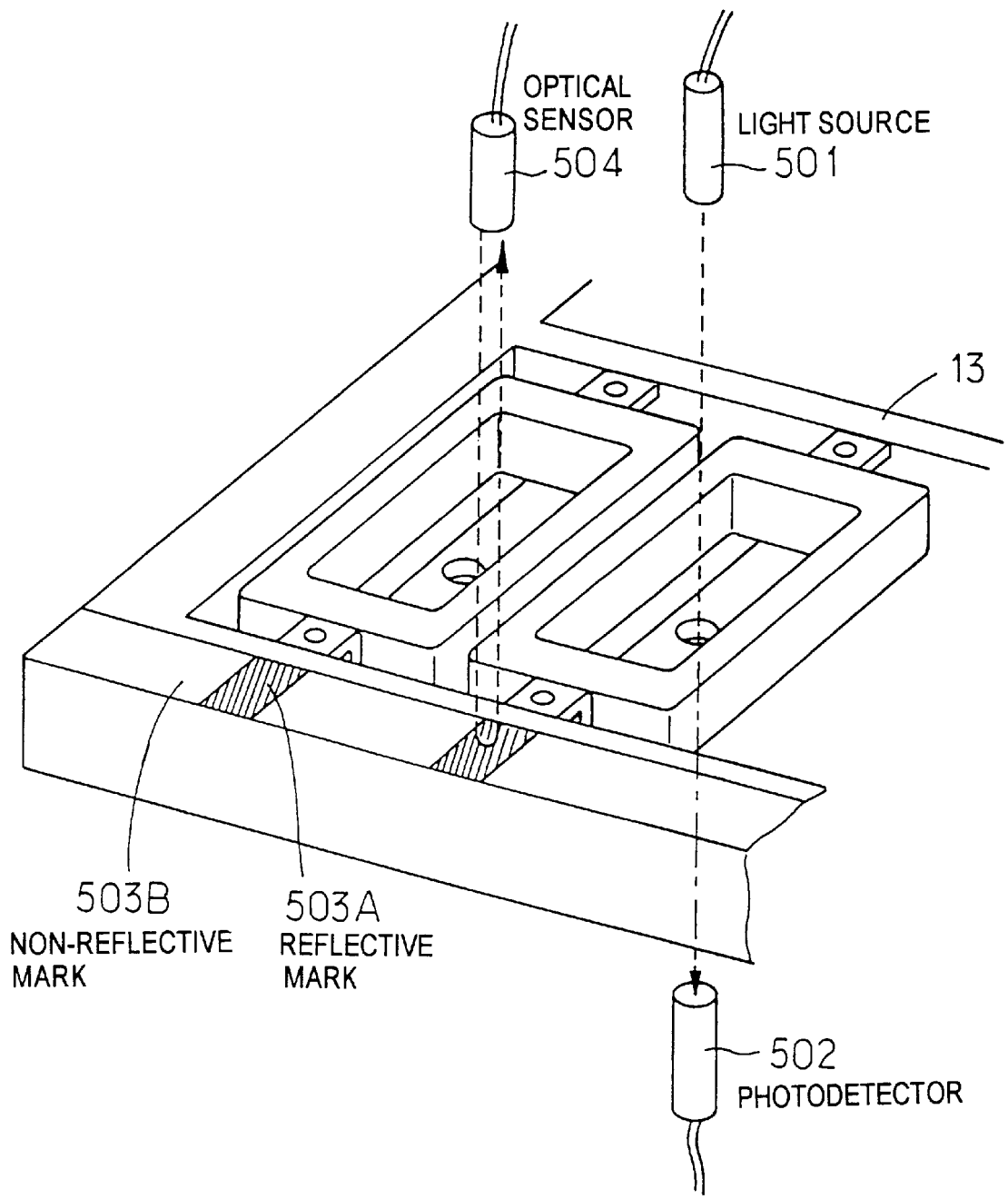
FIG. 13 is an enlarged perspective view showing a portion of the IC testing apparatus shown in FIG. 11.

An aperture (through-hole) 16A is formed in a bottom plate of each IC carrier 16 as shown in FIG. 12. The photodetector 502 detects light passing through the aperture 16A. Since there is an opening through which light from the light source 501 passes (an opening through which pins of an IC loaded on the IC carrier 16 are exposed or the like) in the bottom plate of each IC carrier 16, only the light passing through the aperture 16A must be detected by the photodetector 502. For this purpose, as illustrated in FIG. 13 in enlarged size, reflective marks 503A are affixed, for instance, on one of the sides of the rectangular frame 12 of the test tray TST running parallel to the moving direction of the test tray TST, the reflective marks 503A being applied to positions of the one side of the rectangular frame 12 corresponding to the positions of the apertures 16A of the bottom plates of a set of the IC carriers 16 aligned in the moving direction of the test tray in this embodiment. Each of the reflective marks 503A has its size or length in the moving direction selected to be equal to or a little longer than the diameter of corresponding one of the apertures 16A of the bottom plates of a set of the IC carriers 16 aligned in the moving direction of the test tray. In this embodiment, the rectangular frame 12 of each test tray is made of a non-reflective material, and hence portions of the rectangular frame 12 on which the reflective marks 503A are not affixed serve as non-reflective marks 503B. Accordingly, a reflection type optical sensor 504 is located above the test tray and detects light emitted from the optical sensor 504 and reflected from one of the reflective marks 503A. With the construction as described above, only the light passing through the aperture 16 A can be detected thereby detecting the presence of an IC on the test tray depending upon whether the IC detecting sensor 500 detects light or not while the optical sensor 504 is detecting light reflected from one of the reflective marks 503A.

In the aforementioned embodiment, there is explained a case of detecting whether or not an IC remains on a test tray transported from the unloader section 400 to the loader section 300. However, an alternative arrangement is also possible in which IC detecting sensors 500 are positioned, for example, midway on the path from the loader section 300 to the tester head 104 as well as midway on the path from the tester head 104 to the unloader section 400. With such arrangement, it is possible to detect an empty IC pocket in a test tray resulting from that an IC is dropped out of the test tray while the test tray is transporting from the loader section 300 to the tester head 104 can be detected. Also, it is possible to detect an empty IC pocket in the test tray resulting from that an IC is dropped out of the test tray during the test on the tester head 104.

It is possible to improve the reliability of the IC testing apparatus by providing the IC detecting sensors 500 at any one of the positions as stated above. However, in case the IC detecting sensors 500 are provided at both positions between the unloader section 400 and the loader section 300 and between the tester head 104 and the unloader section 400, or at both positions between the unloader section 400 and the loader section 300 and between the loader section 300 and the tester head 104, the reliability of the IC testing apparatus can be further improved. It is needless to say that if the IC detecting sensors 500 are provided at all the above positions, the reliability of the IC testing apparatus can be improved most.

Further, the relationship of disposition between the reflective marks 503A and the non-reflective marks 503B may be reversed from the state shown in FIG. 13 so that only the light passing through the aperture 16A can be detected thereby detecting the presence of an IC on the test tray depending upon whether the IC detecting sensor 500 detects light or not while the optical sensor 504 is not detecting any reflected light.

In addition to the light transmission type IC detecting sensor, a proximity switch for detecting a metal (a metal in an IC) or a camera having a pattern recognition function or the like may be used as the IC detecting sensor 500.

As explained above, according to the IC testing system of the first embodiment of the present invention, no classifying process of the tested ICs is required in the handler part 11. In addition, according to the IC testing system of the second embodiment of the present invention, only a sorting operation of the tested ICs into two categories such as pass ICs and failure ICs or other suitable two categories is performed in the handler part 11. Therefore, the time interval required for testing the ICs in each IC testing apparatus can be considerably reduced and the testing process can be executed at high speed. Further, even in the second embodiment, only a classifying operation of the tested ICs into two categories may be performed in the handler part 11, and therefore, the configuration or construction of the handler part can be simplified. Consequently, the cost of the handler part 11 can be reduced. In addition, since the data stored in the storage information memory means includes the number of a socket with which an IC under test is brought into contact in the test section, if failure ICs are concentrated in the tested ICs having contacted with a specified socket, the socket can be presumed to be defective. Therefore, there is an advantage that failure of sockets in the test section can be detected. Moreover, since the dedicated classifying machine 3 performs only classifying operation, it can be manufactured at low cost. Consequently, there is an advantage that a low cost IC testing system can be constructed on the whole.

In addition, according to the IC testing apparatus of the first embodiment of the present invention, a feature for detecting an IC remaining on a test tray TST which should have been emptied of the tested ICs is added thereto. Therefore, it is possible to prevent from occurring in the loader section 300 an erroneous operation that an IC is loaded on the remaining IC in the form of a stack. Consequently, an accident can be prevented that, for example, an IC drops out of the test tray in the constant temperature chamber 101 whereby a transporting apparatus located therebelow can be damaged in addition, an erroneous classification can be prevented that the upper IC in the stack is transported without being dropped out of the test tray, is tested, and is discharged to the unloader section 400 where the upper IC is sorted out on the basis of the test results of the lower IC in the stack.

Further, according to the IC testing apparatus o f the second embodiment of the present invention, even if an IC drops from the test tray during the test in the test section or during the transportation time of the test tray from the test section to the unloader section 400, the dropping of the IC can be detected. Therefore, an erroneous operation can be prevented that an IC is virtually classified from the IC pocket on the test tray in which any IC is absent in accordance with the test results stored in the memory means. That is, a classifying operation with respect to the IC pocket on the test tray in which no IC exists can be eliminated and the time required for the entire classifying operation can be reduced.

In addition, according to the IC testing apparatus of the third embodiment of the present invention, even if an empty IC pocket exists on a test tray TST transported to the test section due to a case that an IC is dropped out of the test tray during the transportation time of the test tray from the loader section 300 to the test section, or that the test tray is transported to the test section with an IC pocket emptied of an IC because an IC to be tested could not have been loaded on the test tray in the loader section 300, this empty IC pocket can be detected. Therefore, the test for the empty IC pocket can be eliminated. As a result, a wasteful test is not performed, and so the testing time can be reduced and a high reliable IC testing apparatus can be provided.

While the present invention has been described in the above as being applied to the IC testing apparatus for testing ICs as semiconductor devices, it is needless to say that the present invention is also applicable to testing apparatus for testing semiconductor devices other than ICs, and the same effects are obtained as described above.

What is claimed is:

1. A semiconductor device testing apparatus comprising:
a test section;
a tester part provided in the test section;
a handler part comprising:
   a loader section,
   an unloader section,
   general-purpose trays,
   test trays,
   a loading handler,
   an unloading handler, and
   a transport unit transporting said test trays;
wherein a general-purpose tray loaded with semiconductor devices to be tested is supplied in the loader section of the handler part where a plurality of the semiconductor devices to be tested are transferred from said general-purpose tray to a test tray by said loading handler, said test tray is transported by said transport unit into the test section where said semiconductor devices loaded on said test tray are brought into electrical contact with a tester head of said tester part disposed in said test section to test operation of the semiconductor devices, after completion of the test, said test tray with the tested semiconductor devices loaded thereon is transported by said transport unit from the test section to the unloader section of the handler part where the tested semiconductor devices on said test tray are transferred by said unloading handler from said test tray onto a general-purpose tray, and the general-purpose tray with the tested semiconductor devices loaded thereon is taken out of said semiconductor device testing apparatus; and
a storage information memory unit including a storage memory and a controller for controlling the storage memory, wherein transference of the tested semiconductor devices by said unloading handler from the test tray onto a general-purpose tray in said unloader section is performed without being sorted, the controller of said storage information memory unit controls the storage memory so that storage information of respective tested semiconductor devices, which includes at least a number assigned to each semiconductor device, test results of each semiconductor device, and an identification number of a socket of the tester part used in testing the associated semiconductor device in said test section, is stored in said storage memory every time each tested semiconductor device is stored in a semiconductor device storage portion of one general-purpose tray,
and the general-purpose tray including the tested semiconductor devices thus transferred thereto without being sorted, is taken out of the semiconductor device testing apparatus, so that the tested semiconductor devices can be subjected to at least one of further processes including re-testing and subclassifying of the tested semiconductor devices using said storage information.

2. A semiconductor device testing apparatus comprising:
a test section;
a tester part provided in the test section;
a handler part comprising:
   a loader section,
   an unloader section,
   general-purpose trays,
   a handler unit, and
   a carrier unit transporting semiconductor devices;
wherein semiconductor devices to be tested are transported by said carrier unit into the test section where said semiconductor devices are brought into electrical contact with a tester head of said tester part disposed in said test section to test operation of the semiconductor device, after completion of the test, the tested semiconductor devices are transported by said carrier unit from the test section to the unloader section of said handler part where the tested semiconductor devices are sorted out by said handler unit on the basis of test results of the semiconductor devices and stored in general-purpose trays; and
a storage information memory unit including a storage memory and a controller controlling the storage memory, wherein in said unloader section, the tested semiconductor devices are sorted by said handler unit only into two categories of pass articles and failure articles, so that the semiconductor devices thus sorted are transferred by said handler unit from said carrier unit to only two correspondingly categorized general-purpose trays, respectively, the controller of said storage information memory unit controls the storage memory so that storage information of respective tested semiconductor devices, which includes at least the test results of each semiconductor device, a number assigned to each said semiconductor device, and an identification number of a socket used in testing the associated semiconductor device in said test section, is stored in said storage memory, and the tested semiconductor devices thus transferred into the two classified general-purpose trays corresponding to the only two sorted categories are taken out of the semiconductor testing device and can be subjected to at least one of further processes including re-testing and sub-classifying thereof using said storage information stored in said storage memory.

3. A semiconductor device testing system comprising:
a plurality of semiconductor device testing apparatus, each of said semiconductor device testing apparatuses comprising:
   a test section;
   a tester part provided in the test section; and
   a handler part comprising:
      a handler unit;
      a carrier unit; and
      a transport unit, wherein in each of said semiconductor device testing apparatuses, semiconductor devices to be tested are carried by said carrier unit, which is transported by the transport unit into the test section where said semiconductor devices are brought into electrical contact with a tester head of said tester part disposed in said test section to test operation of the semiconductor device, and after completion of the test, the carrier unit carrying the tested semiconductor devices is transported by the transport unit from the test section to an unloader section of said handler part where the tested semiconductor devices are sorted out on the basis of test results of the semiconductor devices and stored in general-purpose trays, and wherein said plurality of semiconductor device testing apparatus have different test conditions from one another, and semiconductor devices to be tested are transported to said plurality of semiconductor device testing apparatus in order and sequentially undergo tests under the different test conditions in said plurality of semiconductor device testing apparatus, and wherein each of said semiconductor device testing apparatuses performs, in said unloader section, only a sorting operation of the tested semiconductor devices into two categories of pass articles and failure articles based on its testing conditions, the tested semiconductor devices thus sorted into the two categories in each of said semiconductor device testing apparatus are transferred by said handler unit from the carrier unit to two correspondingly categorized general-purpose trays, respectively; and only one of the two categorized general-purpose trays having the tested semiconductor devices which have been determined to be pass articles in one semiconductor device testing apparatus is supplied to the subsequent semiconductor device testing apparatus for testing, and wherein the general-purpose trays having the semiconductor devices which have been determined to be failure articles in a respective semiconductor device testing apparatus are subject to re-testing in another semiconductor device testing apparatus.

4. The semiconductor device testing system according to claim 3, wherein each of said plurality of semiconductor device testing apparatus further comprises storage information memory unit including a storage memory storing storage information of respective tested semiconductor devices which includes at least the test results of each semiconductor device, a number assigned to each semiconductor device, and a number of a socket used in testing the associated semiconductor device in said test section, in said storage memory, and wherein such the semiconductor devices as classified in the category of pass articles upon completion of all the tests by all said plurality of the semiconductor device testing apparatus, are obtained on one general-purpose tray of the category of pass articles from one of the plurality of the semiconductor device testing apparatus connected in sequential order to each other positioned at a rear position thereof, and are subjected to be subclassified using said storage information stored in each said storage memory of each said semiconductor device testing apparatus.

5. A semiconductor device testing apparatus comprising:
   a chamber section including a test section;
   a tester part provided in the test section and testing semiconductor devices to be tested;
   general-purpose trays carrying the semiconductor devices which are supplied into and taken out of the semiconductor device testing apparatus;
   a loading handler provided in a loader section of the semiconductor device testing apparatus, positioned outside of the chamber section at its input side;
   an unloading handler provided in an unloader section of the semiconductor device testing apparatus, positioned outside of the chamber section at its output side;
   a carrier unit carrying a plurality of the semiconductor devices;
   a transport unit transporting said carrier unit in a round path from the loader section, the test section, the unloader section, and to the loader section;
   wherein:
      a general-purpose tray carrying semiconductor devices to be tested is supplied in the loader section,
      a plurality of semiconductor devices to be tested are transferred from said general-purpose tray to the carrier unit by said loading handler in the loader section,
      said carrier unit carrying the thus transferred semiconductor devices to be tested is transported by said transport unit from the loader section into the test section of the chamber section where said semiconductor devices carried by said carrier unit are tested by said tester part disposed in said test section,
      after completion of the test, said carrier unit carrying the thus tested semiconductor devices is transported by said transport unit from the test section to the unloader section where the tested semiconductor devices are transferred by said unloading handler from said carrier unit to a general-purpose tray, and
      the carrier unit thus emptied in the unloader section is transported by said transporting unit to the loader section; and
   a storage information memory part comprising a storage memory and a control unit controlling said storage memory; wherein:
      transference of the tested semiconductor devices by said unloading handler from the associated carrier unit to a general-purpose tray in said unloader section is performed without being sorted,
      the general-purpose tray having the thus transferred tested semiconductor devices is taken out of said semiconductor testing apparatus, and
      the control unit of said storage information memory part controls said storage memory to store therein storage information of each tested semiconductor device, which include at least the test results of each semiconductor device, and a number of tester head used in said test section at an address which represents at least a number assigned to each semiconductor device, an identification number of general-purpose tray to which each semiconductor device is transferred and a number assigned to each of semiconductor device receiving portions of the associated general-purpose tray where each semiconductor device is retained;
      whereby the tested semiconductor devices loaded on a general-purpose tray without being sorted and thus taken out of the semiconductor device testing apparatus can be subjected to at least one of further processes including re-testing and sub-classifying of the test semiconductor devices using said storage information stored in the storage memory.

6. A semiconductor device testing apparatus comprising:
   a test section;
   a tester part provided in the test section and testing semiconductor devices to be tested;
   a handler part comprising:
      a loader section,
      an unloader section,
      test trays and general-purpose trays carrying the semiconductor devices, a loading handler,
      an unloading handler, and
      a transporting unit transporting said test trays in a round path from the loader section, the test section, the unloader section, and back to the loader section;
   wherein:
      a general-purpose tray carrying semiconductor devices to be tested is transported to the loader section,
      a plurality of semiconductor devices to be tested are transferred from said general-purpose tray to a test tray by said loading handler in the loader section,
      said test tray thus loaded with the semiconductor devices to be tested is transported by said transporting unit from the loader section into the test section where said semiconductor devices are tested their operations by said tester part, after completion of the test, said tray loaded with the tested semiconductor devices is transported by said transporting unit from the test section to the unloader section where the tested semiconductor devices are transferred by said unloading handler from said test tray to a general-purpose tray, and the test tray thus emptied in the unloader section is transported by said transporting unit to the loader section; and a storage information memory part comprising a storage memory and a control unit controlling said storage memory, wherein:

transference of the tested semiconductor devices by said unloading handler from the associated test tray to a general-purpose tray in said unloaded section is performed without being sorted, the general-purpose tray having the tested semiconductor devices thus transferred without being sorted is taken out of said semiconductor device testing apparatus, and said control unit of said storage information memory part controls said storage memory so that storage information of each tested semiconductor device, which include at least test results of each semiconductor device, is stored in said storage memory at an address which represents at least a number assigned to each semiconductor device, an identification number of a general-purpose tray on which each semiconductor device is transferred, and a number of a semiconductor device retaining position of the associated general-purpose tray where each semiconductor device is retained, every time each tested semiconductor device is transferred to the general-purpose tray;

whereby the tested semiconductor devices thus transferred to the general-purpose tray without being sorted and thus taken out of the semiconductor device testing apparatus can be subjected to at least one of further processes including re-testing and sub-classifying of the tested semiconductor devices using said storage information stored in the storage memory.

7. A semiconductor device testing system comprising:

a plurality of semiconductor device testing apparatus, each of said semiconductor device testing apparatuses comprising:

a test section;

a tester part provided in the test section; and a handler part comprising:

a handler unit;

a carrier unit; and a transport unit, wherein in each of said semiconductor device testing apparatuses, semiconductor devices to be tested are carried by said carrier unit, which is transported by the transport unit into the test section where said semiconductor devices are brought into electrical contact with a tester head of said tester part disposed in said test section to test operation of the semiconductor device, and after completion of the test, the carrier unit carrying the tested semiconductor devices is transported by the transport unit from the test section to an unloader section of said handler part where the tested semiconductor devices are sorted out on the basis of test results of the semiconductor devices and stored in general-purpose trays, and wherein said plurality of semiconductor device testing apparatus have different test conditions from one another, and semiconductor devices to be tested are transported to said plurality of semiconductor device testing apparatus in order and sequentially undergo tests under the different test conditions in said plurality of semiconductor device testing apparatus, and wherein each of said semiconductor device testing apparatuses performs, in said unloader section, only a sorting operation of the tested semiconductor devices into two categories of pass articles and failure articles based on its testing conditions, the tested semiconductor devices thus sorted into the two categories in each of said semiconductor device testing apparatus are transferred by said handler unit from the carrier unit to two correspondingly categorized general-purpose trays, respectively; and only one of the two categorized general-purpose trays having the tested semiconductor devices which have been determined to be pass articles in one semiconductor device testing apparatus is supplied to the subsequent semiconductor device testing apparatus for testing, and wherein the general-purpose trays having the semiconductor devices which have been determined to be failure articles in a respective semiconductor device testing apparatus are subject to re-testing in another semiconductor device testing apparatus, wherein each of said plurality of semiconductor device testing apparatus further comprises storage information memory unit including a storage memory storing storage information of respective tested semiconductor devices which includes at least the test results of each semiconductor device, a number assigned to each semiconductor device, and a number of a socket used in testing the associated semiconductor device in said test section, in said storage memory, and wherein such the semiconductor devices as classified in the category of pass articles upon completion of all the tests by all said plurality of the semiconductor device testing apparatus, are obtained on one general-purpose tray of the category of pass articles from one of the plurality of the semiconductor device testing apparatus connected in sequential order to each other positioned at a rear position thereof, and are subjected to be subclassified using said storage information stored in each said storage memory of each said semiconductor device testing apparatus, wherein the semiconductor devices as classified in the category of failure articles through all the tests by all said plurality of the semiconductor device testing apparatus, are obtained on general-purpose tray of the category of failure articles from the respective one of the plurality of the semiconductor device testing apparatus, respectively, and are subjected to be re-tested or subclassified using said storage information stored in each said storage memory of each said semiconductor device testing apparatus.

* * * * *

UNITED STATES PATENT AND TRADEMARK OFFICE
CERTIFICATE OF CORRECTION

PATENT NO.:     6,066,822
DATED     :     May 23, 2000
INVENTOR(S):    Nemoto et al.

It is certified that errors appears in the above-identified patent and that said Letters Patent is hereby corrected as shown below:

Column 6,
    line 32, change "upon" to --. Upon--.

Column 11,
    line 6, delete "on the bICs".

Column 12,
    line 17, change "in" to --In--.

Column 14,
    line 16, change "Dockets" to --pockets--.

Column 18,
    line 23, change "Is" to --is--.

Column 20,
    line 31, change "in" to --. In--; and
    line 37, change "o f" to --of--.

Signed and Sealed this

Seventh Day of November, 2000

Attest:

Q. TODD DICKINSON

*Attesting Officer*         *Director of Patents and Trademarks*

UNITED STATES PATENT AND TRADEMARK OFFICE
CERTIFICATE OF CORRECTION

PATENT NO.  : 6,066,822
DATED       : May 23, 2000
INVENTOR(S) : Shin Nemoto, et al.

It is certified that error appears in the above-identified patent and that said Letters Patent is hereby corrected as shown below:

Title page,
Item [75], change the third inventor "Hiroo Nakamur" to read -- Hiroto Nakamura --.

Signed and Sealed this

Ninth Day of October, 2001

Attest:

NICHOLAS P. GODICI
Attesting Officer
Acting Director of the United States Patent and Trademark Office